United States Patent
Yeh et al.

(10) Patent No.: US 9,984,759 B1
(45) Date of Patent: May 29, 2018

(54) DETECTING DATA INTEGRITY IN MEMORY SYSTEMS

(71) Applicant: Macronix International Co., Ltd., Hsinchu (TW)

(72) Inventors: Yuchih Yeh, Hsin-Chu (TW); Yi-Chun Liu, Hsin-Chu (TW); Naiping Kuo, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days. days.

(21) Appl. No.: 15/471,262

(22) Filed: Mar. 28, 2017

(51) Int. Cl.
| | |
|---|---|
| G11C 16/26 | (2006.01) |
| G11C 16/34 | (2006.01) |
| G11C 16/04 | (2006.01) |
| G11C 16/10 | (2006.01) |
| G11C 16/16 | (2006.01) |
| G11C 29/50 | (2006.01) |
| H03M 13/05 | (2006.01) |

(52) U.S. Cl.
CPC ...... *G11C 16/3427* (2013.01); *G11C 16/0483* (2013.01); *G11C 16/10* (2013.01); *G11C 16/16* (2013.01); *G11C 16/26* (2013.01); *G11C 16/3495* (2013.01); *G11C 29/50004* (2013.01); *G11C 29/50016* (2013.01); *H03M 13/05* (2013.01); *G11C 2029/5004* (2013.01)

(58) Field of Classification Search
CPC .................................................. G11C 16/26
USPC .................................................. 365/185.02
See application file for complete search history.

(56) References Cited

U.S. PATENT DOCUMENTS

| | | | |
|---|---|---|---|
| 7,623,385 B2 | 11/2009 | Kim et al. | |
| 8,995,213 B2 | 3/2015 | Song | |
| 9,245,637 B2 | 1/2016 | Yang et al. | |
| 9,263,146 B2 | 2/2016 | Kim | |
| 2008/0049507 A1* | 2/2008 | Lee | G11C 7/02 365/185.17 |
| 2008/0285341 A1* | 11/2008 | Moschiano | G11C 16/3418 365/185.02 |
| 2013/0003454 A1* | 1/2013 | Edahiro | G11C 16/26 365/185.02 |
| 2013/0094289 A1* | 4/2013 | Sridharan | G11C 11/5628 365/185.03 |
| 2013/0258770 A1* | 10/2013 | Goss | G11C 16/26 365/185.02 |
| 2014/0063998 A1* | 3/2014 | Song | G11C 16/349 365/201 |

(Continued)

*Primary Examiner* — Min Huang
(74) *Attorney, Agent, or Firm* — Fish & Richardson P.C.

(57) ABSTRACT

Systems, methods, and apparatus including computer-readable mediums for detecting data integrity, e.g., read disturbance and/or data retention, of memory systems such as NAND flash memory devices are provided. For detection of read disturbance, an indicator string in a block of a memory can be filled with a predetermined state and read with a special read condition to check read disturbance of the block in one read operation. For detection of data retention, a page of a dedicated block in a memory can be chosen as an indicator page. The indicator page can be filled with a predetermined pattern and read with a proper voltage to quantify a retention shift and further to evaluate other data blocks in the memory with the qualified retention shift. The techniques enable a quick method to examine memory and help to refresh memory before data corruption.

20 Claims, 12 Drawing Sheets

(56) References Cited

U.S. PATENT DOCUMENTS

2015/0213877 A1\* 7/2015 Darel ................ G11C 11/40618
711/106
2016/0078960 A1\* 3/2016 Yang .................. G11C 16/3422
365/185.02

\* cited by examiner

Data blocks Time stamp information

Table A

Data blocks P/E cycle information

Table B

Relation of Retention vs P/E cycle

Table C

FIG. 8B

DETECTING DATA INTEGRITY IN MEMORY SYSTEMS

BACKGROUND

Some memory systems, e.g., NAND flash memory, experience data corruption which may impact data integrity. To prevent the data corruption, a memory controller can probe memory cells and refresh deficient cells. However, in some cases, the probe action is time-consuming and leads to disturbance.

SUMMARY

The present disclosure describes systems and techniques for detecting data integrity, e.g., read disturbance and/or data retention, of memory systems, e.g., non-volatile memory systems such as NAND flash memory.

One aspect of the present disclosure features a memory system for detection of read disturbance, including: a memory comprising multiple blocks each having a plurality of strings; and a memory controller configured to detect read disturbance of the memory by applying a read voltage to a plurality of memory cells of an indicator string in a particular block in the memory, the plurality of memory cells being coupled in series to a corresponding bit line, the memory cells being in a predetermined state and having a threshold voltage corresponding to the predetermined state, the read voltage being larger than the corresponding threshold voltages of the memory cells; and detecting a voltage change of the corresponding bit line to determine whether at least one memory cell in the indicator string suffers from read disturbance.

In some cases, the memory controller is configured to identify the indicator string in the particular block in the memory. In some cases, the memory controller is configured to apply a precharge voltage to the corresponding bit line before applying the read voltage to the plurality of memory cells. In some cases, the memory controller is configured to, if the voltage change of the corresponding bit line is detected, determine at least one of: a) no memory cell in the indicator string having a present threshold voltage larger than the read voltage, or b) no memory cell in the indicator string suffering from read disturbance. In some cases, the memory controller is configured to: identify the particular block from the blocks based on a predetermined condition; and perform the detection of the read disturbance in the particular block.

In some implementations, the memory controller is configured to, if the voltage change of the corresponding bit line is not detected, determine at least one of: a) at least one memory cell in the indicator string having a present threshold voltage larger than the read voltage, or b) at least one memory cell in the indicator string suffering from read disturbance. The memory controller can be configured to, in response to determining that at least one memory cell in the indicator string suffers from read disturbance, log the particular block as a high risk block.

In some implementations, the memory controller is configured to: apply a second read voltage to a second plurality of memory cells of a second indicator string in the particular block, the second plurality of memory cells being coupled in series to a second corresponding bit line, the second plurality of memory cells being in a second predetermined state and having a second threshold voltage corresponding to the second predetermined state, the second read voltage being larger than the corresponding second threshold voltages of the second plurality of memory cells; detect a voltage change of the second corresponding bit line to determine whether at least one memory cell in the second indicator string suffers from read disturbance; and determine whether the particular block is a high risk block based on a first result of determining whether at least one memory cell in the indicator string suffers from read disturbance and a second result of determining whether at least one memory cell in the second indicator string suffers from read disturbance. The indicator string and the second indicator string can be arranged adjacent to respective data strings for storing data in the particular block.

In some implementations, the memory controller is configured to: identify a portion of the particular block including memory cells in a second state, the second state being different from the predetermined state, the memory cells in the second state having a second threshold voltage smaller than the threshold voltages of the memory cells in the predetermined state; and apply a second read voltage to one or more memory cells in the indicator string that is in the portion of the particular block and has the second state, the second read voltage being smaller than the read voltage.

The memory cells can be capable to be programmed into a first state to have a first corresponding threshold voltage and a second state to have a second corresponding threshold voltage larger than the first corresponding threshold voltage, and the predetermined state can be the first state, and the read voltage can be between the first corresponding threshold voltage and the second corresponding threshold voltage.

Another aspect of the present disclosure features a memory system for detection of data retention, including: a memory comprising multiple blocks each including a plurality of pages; and a memory controller configured to detect data retention of the memory by selecting a page in a block of the memory as an indicator page, the page including a plurality of memory cells coupled in series to a corresponding word line; programming the indicator page with a predetermined pattern in which the memory cells in the indicator page are in at least one programmed state, the memory cells having a threshold voltage corresponding to the programmed state; performing a read operation on the indicator page by applying at least one retention read voltage to the corresponding word line of the indicator page and a pass voltage to word lines coupled to the other pages in the block, the retention read voltage being smaller than the threshold voltage; and determining a risk level of one or more other blocks in the memory based on a result of the performed read operation on the indicator page in the block.

In some implementations, the memory controller is configured to determine a retention shift of the memory cells in the indicator page based on a result of the performed read operation on the indicator page. In some examples, the memory cells in the indicator page are coupled within respective strings connected to respective bit lines, and the memory controller is configured to: after performing the read operation on the indicator page, detect voltage changes of the respective bit lines; in response to determining that the voltage changes for the respective bit lines are not detected, increase the retention read voltage to perform a next read operation until the voltage changes are detected on the respective bit lines when the retention read voltage reaches a present threshold voltage; and in response to determining that the voltage changes for the respective bit lines are detected, decrease the retention read voltage to perform a next read operation until the voltage changes for the respective bit lines are not detected when the retention read voltage reaches the present threshold voltage, the present threshold voltage being smaller than the threshold voltage, the retention shift of the memory cells determined to be a difference between the threshold voltage and the present threshold voltage.

In some examples, determining a risk level of one or more other blocks includes determining the risk level of the one more other blocks based on the determined retention shift and one or more corresponding parameters of the one or more other blocks, the parameters including at least one of time stamp information, P/E cycle information, retention shift information, or a relation between retention shifts and P/E cycles.

In some examples, the memory controller is configured to: determine that the indicator page fails if the determined retention shift of the memory cells is no smaller than a predetermined retention shift threshold; and determine that the indicator page passes if the determined retention shift of the memory cells is smaller than the predetermined retention shift threshold. The memory controller can be configured to, in response to determining that the indicator page fails, program a blank page in the block with a new predetermined pattern as a new indicator page.

In some implementations, the memory controller is configured to determine a number of failed memory cells based on a result of the performed read operation on the indicator page, the failed memory cells having a present threshold voltage smaller than the retention read voltage, and determining a risk level of one or more other blocks can include determining the risk level of the one more other blocks based on the determined number of failed memory cells and one or more corresponding error-correcting code (ECC) bit numbers of the one or more other blocks.

In some implementations, the memory cells in the memory are capable to be programmed into a first state to have a first corresponding threshold voltage and into a second state to have a second corresponding threshold voltage larger than the first corresponding threshold voltage. The programmed state can be the second state, the retention read voltage can be between the first corresponding threshold voltage and the second corresponding threshold voltage, and the pass voltage can be larger than the second corresponding threshold voltage. In some examples, the predetermined pattern of the indicator page includes a first plurality of memory cells being in the first state and a second plurality of memory cells being in the second state, and performing the read operation on the indicator page includes: performing a first read operation on the first plurality of memory cells by applying a first retention read voltage to the corresponding word line of the indicator page, the first retention read voltage being smaller than the first corresponding threshold voltage; and performing a second read operation on the second plurality of memory cells by applying a second retention read voltage to the corresponding word line of the indicator page, the second retention read voltage being smaller than the second corresponding threshold voltage.

The memory controller can be configured to receive a request from an external device to detect data retention of the memory; and perform the read operation on the indicator page in the block in response to the request.

A further aspect of the present disclosure features a memory system for detection of data integrity, including: a memory comprising multiple blocks, each block having memory cells that are coupled in series to column bit lines to form strings and to row word lines to form pages; and a memory controller configured to detect data integrity of the memory by performing at least one of: first operations for detecting read disturbance of the memory, or second operations for detecting data retention of the memory. The first operations include: applying a read voltage to a plurality of memory cells of an indicator string in a particular block in the memory, the plurality of memory cells being coupled in series to a corresponding bit line, the plurality of memory cells being in a predetermined state and having a threshold voltage corresponding to the predetermined state, the read voltage being larger than the threshold voltages of the plurality of memory cells; and detecting a voltage change of the corresponding bit line to determine whether read disturbance occurs in the indicator string. The second operations include: selecting a page in a block of the memory as an indicator page, the page including a plurality of memory cells coupled in series to a corresponding word line; programming the indicator page with a predetermined pattern in which the memory cells in the indicator page are in at least one programmed state, the memory cells having a threshold voltage corresponding to the programmed state; performing a read operation on the indicator page by applying at least one retention read voltage to the corresponding word line of the indicator page and a pass voltage to word lines coupled to the other pages in the block, the retention read voltage being smaller than the threshold voltages of the memory cells in the programmed state; and determining a risk level of one or more other blocks in the memory based on a result of the performed read operation on the indicator page in the block.

In some implementations, the one or more other blocks includes the particular block, and the memory controller is configured to determine whether the particular block is a high risk block based on a first result of determining whether the read disturbance occurs in the indicator string of the particular block and a second result of determining the risk level of the particular block based on the result of the performed read operation on the indicator page.

Implementations of the above techniques include methods, systems, computer program products and computer-readable media. In one example, a method can be performed by a memory controller coupled to a non-volatile memory and the method can include the above-described actions performed by the memory controller, e.g., the actions for detecting read disturbance and/or the actions for detecting data retention. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be implemented for any type of controllers to save search time to find risky memory that suffers from read disturbance, data retention, and/or other disturbance effects. The techniques can provide a quick method to examine memory and help to refresh memory before data corruption. Also, the techniques can use an indicator string in a block to detect read disturbance of the whole block in one read operation such that the other data strings in the block are not disturbed during the read operation. The techniques can use an indicator page in a check block in a read operation to perform risk assessment of other data blocks, such that the other data blocks are not disturbed during the read operation.

The techniques can be applied to various memory types, such as SLC (single-level cell) devices, or MLC (multi-level cell) devices like 2-level cell devices or TLC (triple-level cell) devices. The techniques can be applied to various types of non-volatile memory systems, such as NAND flash memory, among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 8B illustrates example tables of information of blocks, according to one or more implementations.

DETAILED DESCRIPTION

Nonvolatile memory devices, e.g., NAND flash memory devices, may have two issues to impact data integrity: one is read disturbance caused by repeated read operations, and another is data retention caused by memory cell characteristics such as a time elapsing effect and/or a P/E (programmed/erased) cycle effect.

Implementations of the present disclosure provide systems and methods for quickly and efficiently examining the nonvolatile memory devices for read disturbance, data retention, and/or other disturbance effects. For example, for detection of read disturbance, one or more indicator strings in a block can be filled with a predetermined pattern, e.g., memory cells in the indicator strings being in a predetermined state, and read with a special read condition to check read disturbance of the whole block in one read operation. For detection of data retention, a page of a dedicated block in a memory can be chosen as an indicator page. The indicator page can be filled with a predetermined pattern and read with a proper voltage to quantify a retention shift, which can be used to evaluate other data blocks in the memory.

Figure 1A:
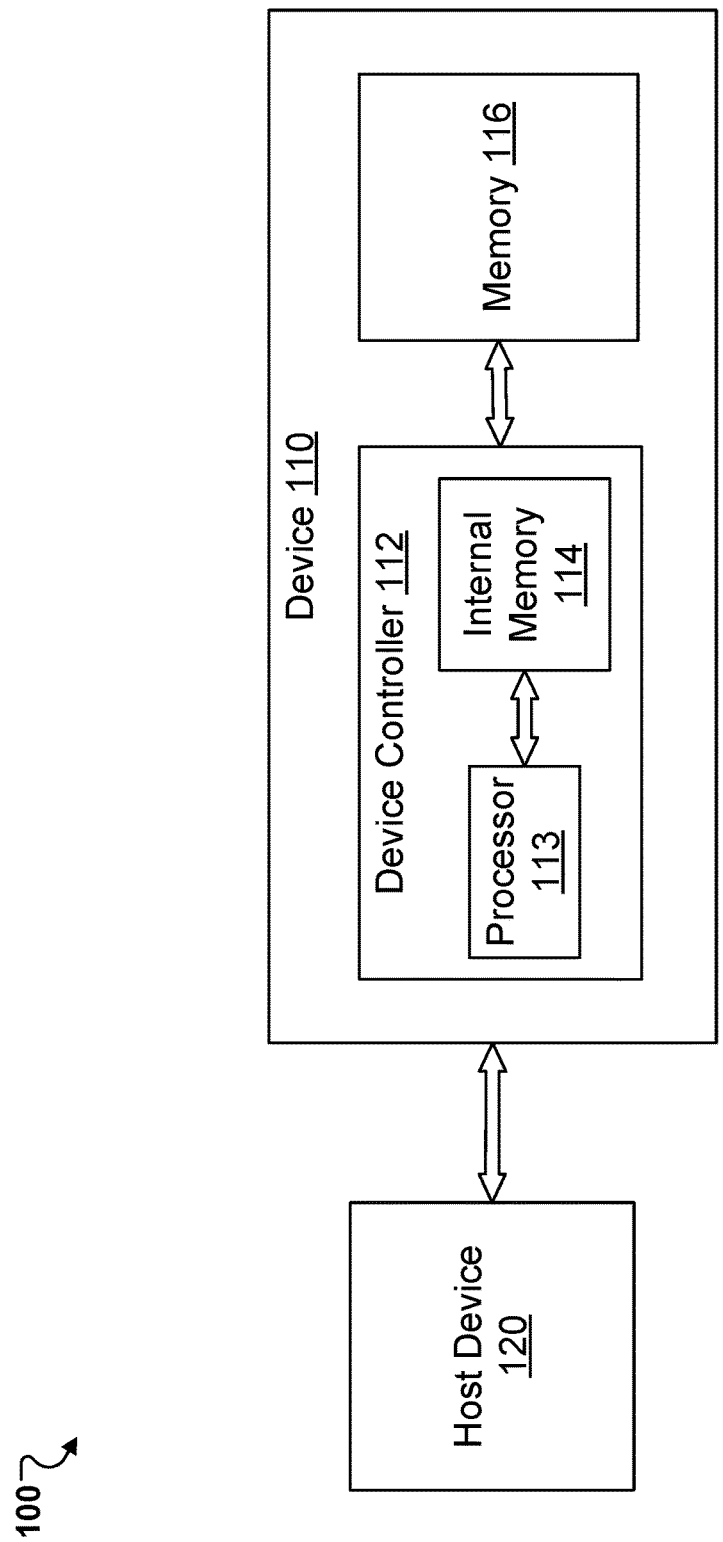
FIG. 1A illustrates an example of a system for detection of data integrity, according to one or more implementations.

FIG. 1A illustrates an example of a system 100 for detection of data integrity. The system 100 includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. For illustration purposes only, the following description uses a NAND flash memory as an example of the memory 116.

As discussed in further details below, the device controller 112 is configured to detect data integrity, e.g., read disturbance and/or data retention, for the memory 116. The device controller 112 can detect the read disturbance and the data retention in the memory 116 individually or together. The device controller 112 can detect the read disturbance and/or the data retention in the memory 116 in a series of scenarios, e.g., in response to an external request or command (such as a host request or command from the host device 120), or automatically based on predetermined conditions, or during background operation.

Figure 1B:
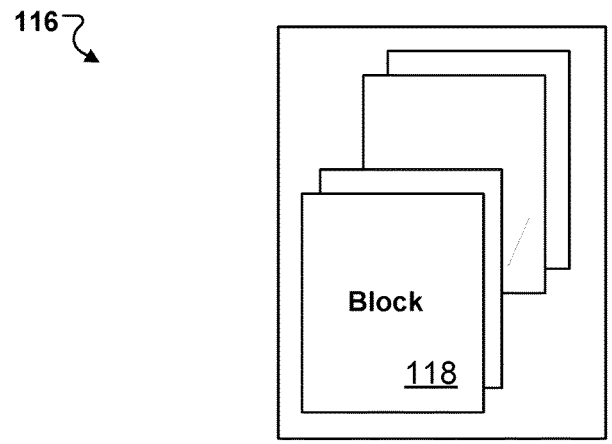
FIG. 1B illustrates an example memory, according to one or more implementations.
Figure 1C:
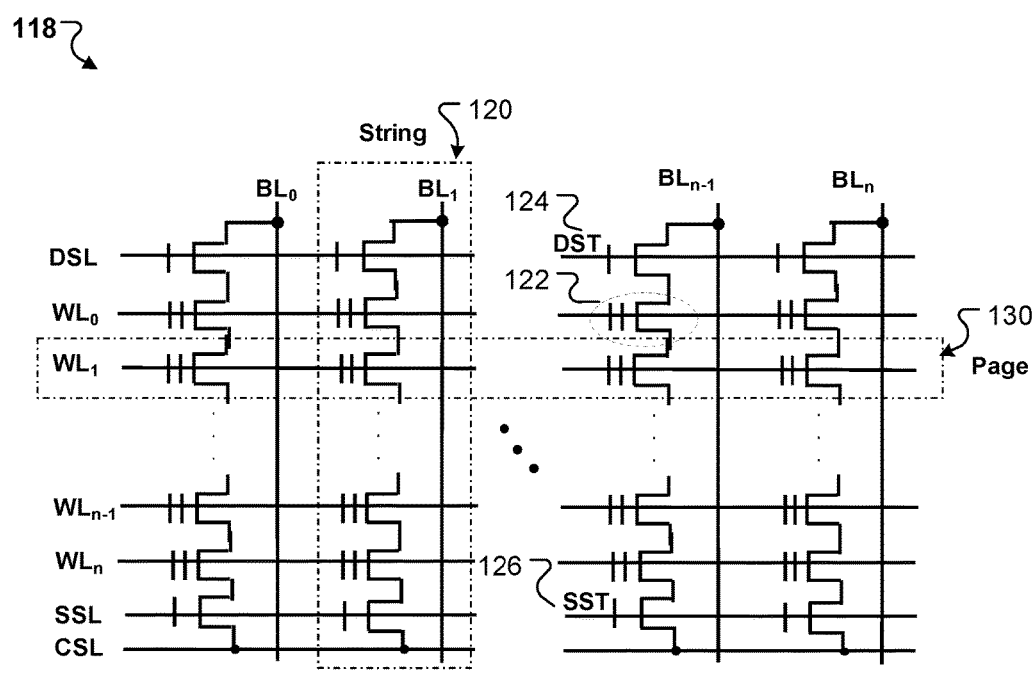
FIG. 1C illustrates an example block in a memory, according to one or more implementations.

FIG. 1B illustrates an example configuration of the memory 116 that includes a plurality of blocks 118. FIG. 1C illustrates an example configuration of a block 118 of the memory 116. The block 118 includes a number of memory cells 122 that are coupled in series to column bit lines $BL_0$, $BL_1$, ..., $BL_{n-1}$, and $BL_n$ to form a plurality of cell strings 120, and to row word lines $WL_0$, $WL_1$, ..., $WL_{n-1}$, and $WL_n$ to form a plurality of cell pages 130.

In some implementations, a cell string 120 includes a drain select transistor (DST) 124, a plurality of memory cells 122, and a source select transistor (SST) 126, which are all connected in series. A drain of the DST 124 is connected to a bit line BL, and its source is connected to a drain of the memory cell 122. A gate of the DST 124 is connected to a drain select line (DSL). Gates of the DSTs in different strings are also connected to the same DSL. Gates of the memory cells 122 are respectively connected to word lines $WL_0$, $WL_1$, ..., $WL_{n-1}$, $WL_n$. A drain of the SST 126 is connected to a source of the memory cells 122, and its drain is connected to a common source line (CSL). A gate of the SST 126 is connected to a source select line (SSL). Gates of the SSTs in different strings are also connected to the same SSL. The DST 124 and the SST 126 can be metal-oxide-semiconductor (MOS) transistors, and the memory cells 122 can be floating gate transistors.

In some implementations, a cell page 130 includes a plurality of memory cells 122. Gates of the memory cells 122 in the cell page 130 are coupled in series to a respective word line WL. When an input voltage is applied to the word line, the input voltage is also applied to all the gates of the memory cells 122 in the cell page 130.

A memory cell can have an erased state or a programmed state. The memory cell can be a single-level cell (SLC) or a multi-level cell (MLC) such as a 2-level cell or a triple-level cell (TLC). For illustration purposes only, the following description uses an MLC (2-level) as an example of the memory cell.

FIGS. 2A to 5B show example implementations of detecting read disturbance of a memory system, e.g., the memory 116 of FIGS. 1A-1C, using a memory controller, e.g., the device controller 112 of FIG. 1A.

Figure 2A:
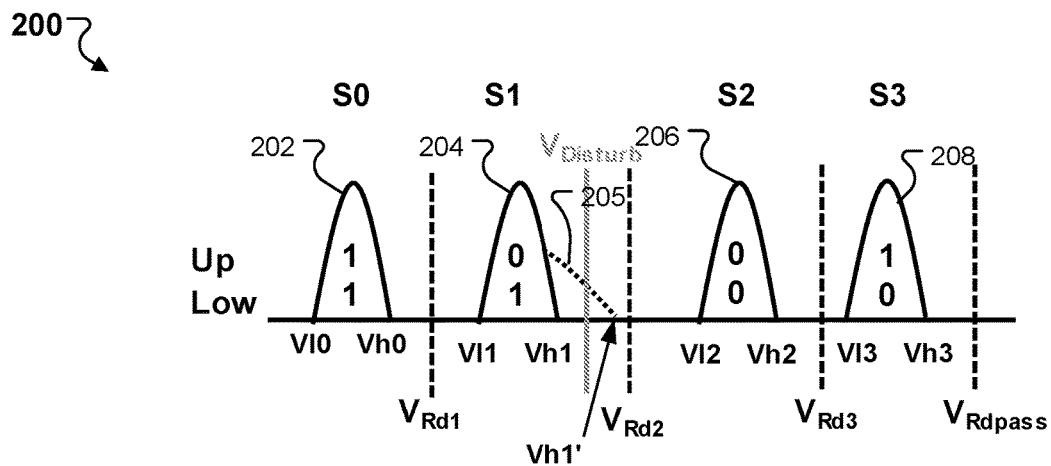
FIG. 2A illustrates an example of threshold voltage distributions and read voltages of memory cells for different states, according to one or more implementations.

Referring to FIG. 2A, an example 200 of threshold voltage distributions and read voltages of a memory cell, e.g., the memory cell 122 of FIG. 1C, for different states is illustrated. The memory cell can be an MLC capable of storing two-bit data. The memory cell can be programmed or erased to have any one of four states S0, S1, S2, and S3. In some examples, S0 is an erased state (1,1), and S1, S2, S3 are a plurality of programmed states P1 (0, 1), P2 (0, 0), and P3 (1, 0). Once programmed or erased, the memory cell has a corresponding threshold voltage. The threshold voltage is a characteristic of the memory cell. As noted above, the memory cell can be a floating gate transistor. When a read voltage higher than or identical to the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Each state corresponds to a distribution of threshold voltages between a range between a lower limit voltage and a higher limit voltage. A memory cell having a threshold voltage within the range is considered to be in the corresponding state. In other words, a memory cell being in a state has a threshold voltage within the range. For example, if the memory cell has a threshold voltage between Vl0 and Vh0, the memory cell is in the state S0; if the memory cell has a threshold voltage between Vl1 and Vh1, the memory cell is in the state S1; if the memory cell has a threshold voltage between Vl2 and Vh2, the memory cell is in the state S2; and if the memory cell has a threshold voltage between Vl3 and Vh3, the memory cell is in the state S3. Curves 202, 204, 206, 208 show threshold voltage distributions of the respective states S0, 51, S2, S3 of the memory cell, respectively.

During a read operation, a read voltage can be applied to a word line coupled to a gate of the memory cell to determine whether the selected memory cell is a turned-on or turned-off state. When a read voltage $V_{Rd1}$ that is larger than the threshold voltage of S0 but smaller than the threshold voltage of S1 is applied, the memory cell is turned on when it has the state S0 and turned off when it has the state S1, S2, or S3; when a read voltage $V_{Rd2}$ that is larger than the threshold voltage of S1 but smaller than the threshold voltage of S2 is applied, the memory cell is turned on when it has the state S0 or S1 and turned off when it has the state S2, or S3; when a read voltage $V_{Rd3}$ that is larger than the threshold voltage of S2 but smaller than the threshold voltage of S3 is applied, the memory cell is turned on if it has the state S0, S1, or S2 and off when it has the state S3. When the read voltage $V_{Rdpass}$ that is larger than all the threshold voltages of the states S0, S1, S2, S3 is applied, the memory cell is turned on regardless of whatever state the memory cell had.

Due to repeated read operations, a read disturbance phenomenon may occur. In the read disturb phenomenon, a threshold voltage of the memory cell abnormally increases. As illustrated in FIG. 2A, in some cases, the distribution curve 204 for the state S1 includes a dotted curve 205, which includes a higher threshold voltage. For example, the new higher limit voltage Vh1' is larger than the higher limit voltage Vh1. When a read voltage $V_{Disturb}$ is applied, the memory cell having a threshold voltage in the state S1 becomes a turned-off state instead of a turned-on state. Thus, by detecting whether the memory cell is on or off under a specific read condition, it can be determined that whether or not the memory cell suffers from read disturbance. In some cases, memory cells being in states having lower threshold voltages, e.g., S0 and S1, are susceptible to read disturbance.

Figure 2B:
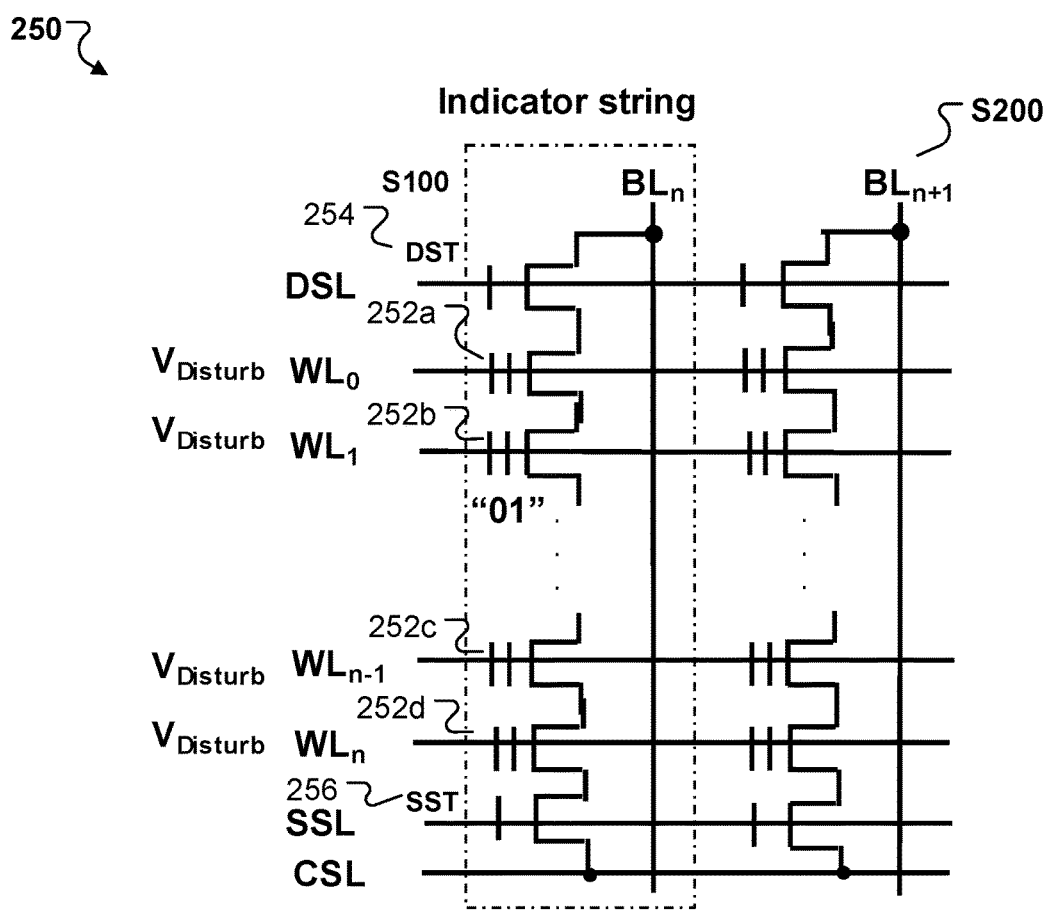
FIG. 2B shows an example circuit diagram illustrating a method of detecting read disturbance in a block of a NAND flash memory device, according to one or more implementations.

FIG. 2B shows an example circuit diagram 250 illustrating a method of detecting read disturbance in a block of a NAND flash memory device, according to one or more implementations. The block includes a plurality of strings, e.g., the string 120 of FIG. 1C. One of the strings can be selected as an indicator string S100. Another string S200 can be a data string for storing data.

The indicator string S100 includes a drain select transistor (DST) 254, a plurality of memory cells 252a, 252b, 252c, 252d, and a source select transistor (SST) 256, which are all connected in series. A drain of the DST 254 is connected to a bit line $BL_n$, and its source is connected to a drain of the memory cell 252a. A gate of the DST 254 is connected to a drain select line (DSL). Gates of the memory cells 252a, 252b, 252c, 252d are respectively connected to word lines $WL_0, WL_1, \ldots, WL_{n-1}, WL_n$. A drain of the SST 256 is connected to a source of the memory cells 252d, and its drain is connected to a common source line (CSL). A gate of the SST 256 is connected to a source select line (SSL).

The indicator string S100 has a predetermined pattern, e.g., all the memory cells in the indicator string S100 are in the same state S1 (or "01"). Each memory cell has a corresponding threshold voltage corresponding to the state S1, e.g., in a range between Vl1 and Vh1. The memory cells in the indicator string S100 can be programmed to be in the state when other data strings in the same block are programmed. The indicator string S100 can be adjacent to the data strings, e.g., the data string S200. The data strings may have read disturbance effect similar to the indicator string S100. Thus, read disturbance in other strings of the block can be determined based on the detection of read disturbance in the indicator string S100.

Read disturbance in the indicator string S100 can be detected by one read operation. During the read operation, a read voltage $V_{Disturb}$ is applied to the memory cells 252a, 252b, 252c, 252d in the indicator string S100, e.g., to word lines $WL_0, WL_1, \ldots, WL_{n-1}, WL_n$ that are coupled to the gates of the memory cells 252a, 252b, 252c, 252d. As illustrated in FIG. 2A, the read voltage $V_{Disturb}$ is larger than the threshold voltage of the memory cells, e.g., Vh1, but smaller than predetermined threshold voltages for S2 and S3 and the pass voltage $V_{Rdpass}$. Then, a voltage change of the corresponding bit line $BL_n$ coupled to the indicator string S100 can be detected, which can be used to determine whether at least one memory cell in the indicator string S100 suffers from read disturbance.

In some implementations, the bit line $BL_n$ coupled to the indicator string S100 is precharged, e.g., to be approximately 1 V. Other bit lines, e.g., $BL_{n+1}$, coupled to other strings, e.g., 5200, in the block can be coupled to a ground voltage, e.g., 0 V. Then, a predetermined level voltage, e.g., a drain select transistor (DST)'s turn on voltage, is applied to the drain select line DSL to turn on the DST 254. Another predetermined level voltage, e.g., a source select transistor (SST)'s turn on voltage, is also applied to the source select line SSL to turn on the SST 256. The read voltage $V_{Disturb}$ can be applied to the memory cells when the DST 254 is turned on and the SST 256 is turned on.

In some cases, when all the memory cells 252a, 252b, 252c, 252d in the indicator string S100 are turned on, a path is formed for transferring electric charges along the indicator string S100. The electric charges precharged in the bit line $BL_n$ are discharged into the cell source line CSL, and a voltage change, e.g., a decrease of the voltage, of the bit line $BL_n$ occurs, which can be detected. It is more accurate to determine whether the bit line $BL_n$ is discharged or not (or has a voltage change) after a sufficient discharging time has elapsed.

In some cases, when at least one of the memory cells in the indicator string S100 is turned off, the path is not formed for transferring the electric charges along the indicator string S100, the electric charges precharged in the bit line $BL_n$ cannot be discharged and maintain their states, thus, there is no voltage change for the bit line $BL_n$. That is, the voltage of the bit line $BL_n$ keeps constant, which can be also detected.

Thus, by detecting the voltage change of the bit line $BL_n$ coupled to the indicator string S100, whether at least one memory cell is turned on or off can be determined. Accordingly, whether or not at least one memory cell has a present threshold voltage larger than the read voltage $V_{Disturb}$ can be determined. The present threshold voltage is the threshold voltage that the memory cell has when the read voltage $V_{Disturb}$ is applied. If the voltage of the bit line $BL_n$ changes, it can be determined that all the memory cells in the indicator string are turned on and have a present threshold voltage smaller than or identical to the read voltage $V_{Disturb}$ and that no memory cell in the indicator string suffers from read disturbance.

If there is no voltage change of the bit line $BL_n$, it can be determined that at least one memory cell in the indicator string is turned off and has a present threshold voltage larger than the read voltage and that the at least one memory cell in the indicator string suffers from read disturbance. As noted above, other strings in the block may have similar properties to the indicator string, and read disturbance in other strings of the block can be determined based on the detection of read disturbance in the indicator string. Thus, if memory cells in the indicator string suffer from read disturbance, memory cells in other strings can also suffer from read disturbance. In some cases, in response to determining that at least one memory cell in the indicator string suffers from read disturbance, the block is determined to be a high risk block. The block can then be erased or corrected, e.g., by ECC data.

Thus, the whole block can be probed to detect read disturbance within one read operation, which can save probe time. In addition, as noted above, for the indicator string with a predetermined state S1 ("01"), the read voltage $V_{Disturb}$ is larger than the threshold voltage, e.g., Vh1, but smaller than predetermined threshold voltages for S2 and S3 and the pass voltage $V_{Rdpass}$. Thus, memory cells, e.g., in other strings such as S200, having a state S2 or S3 are not turned on or disturbed during the read operation for the indicator string S100.

In some examples, the read voltage $V_{Disturb}$ is a predetermined read disturbance threshold voltage. When the read voltage $V_{Disturb}$ is applied to a memory cell, the memory controller can determine that the memory cell does not suffer from read disturbance if the memory cell is turned on; the memory controller can determine that the memory cell suffers from read disturbance if the memory cell is turned off. In some examples, the memory controller can increase or decrease the read voltage $V_{Disturb}$ to identify the present higher limit voltage Vh1'. A read disturbance shift of the memory cell can be determined to be a difference of the original and present higher limit voltages, e.g., Vh1'−Vh1.

Figure 3A:
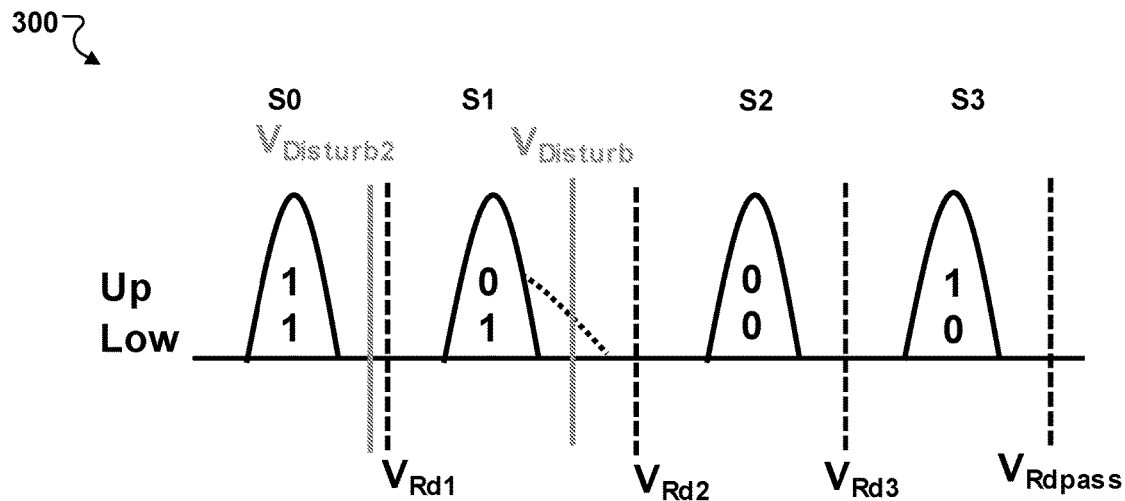
FIGS. 3A-3B illustrate another example of a method of detecting read disturbance in a block of a NAND flash memory device, according to one or more implementations.
Figure 3B:
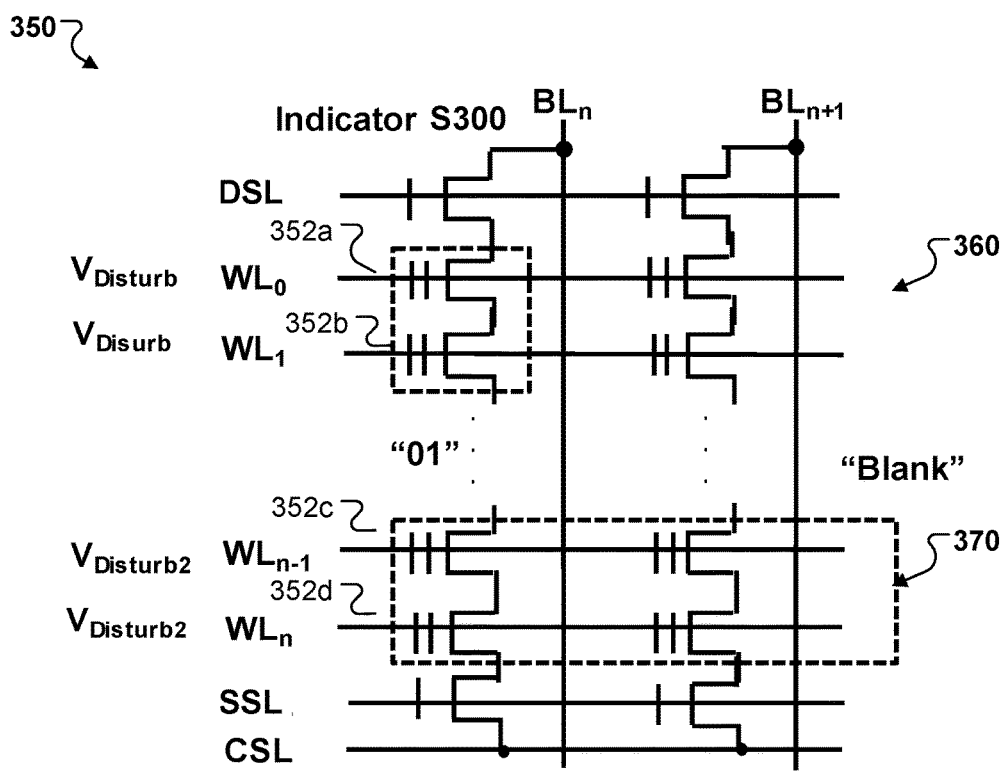

FIGS. 3A-3B illustrate examples 300 and 350 of methods of detecting read disturbance in a block of a NAND flash memory device, according to one or more implementations.

The block can include a first portion including memory cells each having a first threshold voltage in a first state and a second portion including memory cells each having a second threshold voltage in a second state, and the first threshold voltage is larger than the second threshold voltage. In a read operation for detection of read disturbance, a first read voltage can be applied to the first portion and a second read voltage can be applied to the second portion. To reduce disturbance on the memory cells in the second portion, the second read voltage can be smaller than the first read voltage.

As illustrated in FIG. 3B, the block is not completely programmed, which includes a programmed portion 360 and an un-programmed (or blank) portion 370. The indicator string S300 includes memory cells 352a, 352b in the programmed portion 360 and memory cells 352c, 352d in the blank portion 370. The memory cells 352a, 352b are in a predetermined state S1 ("01"), and the memory cells 352c, 352d are in an erased state S0 ("11"). In a read operation for detection of read disturbance, a first read voltage $V_{Disturb}$ is applied to the memory cells 352a, 352b in the programmed portion 360, e.g., to word lines $WL_0$, $WL_1$ that are connected to gates of the memory cells 352a, 352b. To reduce disturbance on memory cells in the blank portion 370, a second, different read voltage $V_{Disturb2}$ can be applied to the memory cells 352c, 352d in the blank portions 370, e.g., to word lines $WL_{n-1}$, $WL_n$ that are connected to gates of the memory cells 352c, 352d. As illustrated in FIG. 3A, the second read voltage $V_{Disturb2}$ is smaller than the first read voltage $V_{Disturb}$.

Figure 4:
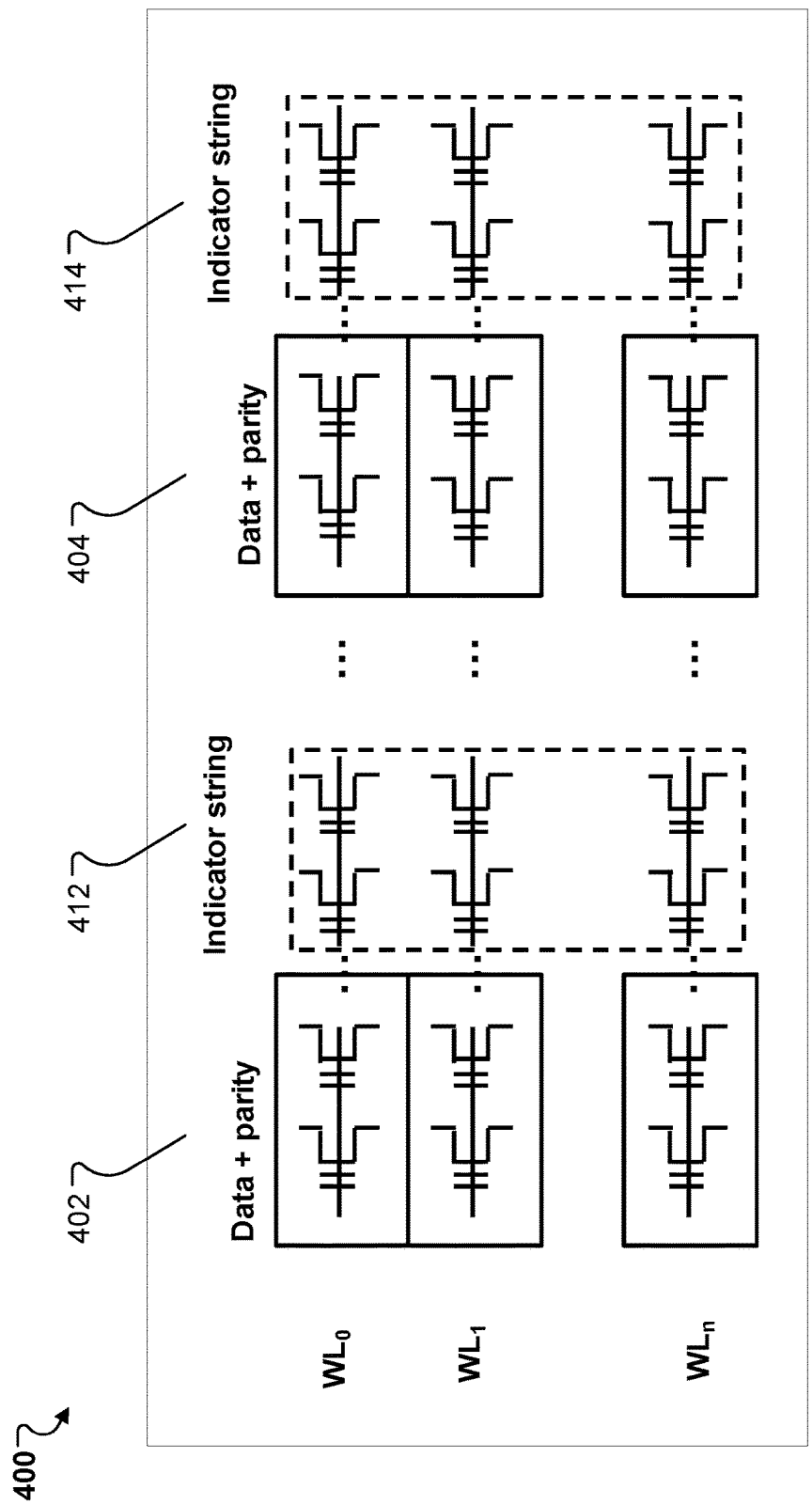
FIG. 4 shows an example block with an arrangement of indicator strings, according to one or more implementations.

FIG. 4 shows an example block 400 with an arrangement of indicator strings, according to one or more implementations. In some cases, as illustrated in FIGS. 2B and 3B, each word line is coupled to one memory cell in an indicator string. In some cases, as illustrated in FIG. 4, each word line can be coupled to two or more memory cells in an indicator string. That is, an indicator string can include two or more single strings that are coupled to respective bit lines. Each block can include one or more indicator strings. The indicator strings can be disturbed, e.g., evenly, in the block. As illustrated in FIG. 4, data strings 402, 404 include programmed data and parity data, e.g., error detecting code (ECC), for the programmed data. Indicator strings 412, 414 include predetermined patterns (e.g., states) for detection of read disturbance. The indicator strings 412, 414 can be adjacent to the data strings 402, 404, respectively. Higher detection accuracy can be achieved with more indicator strings in the block 400. The indicator string 412 or 414 can be stored in every ECC chuck of each block or in an ECC chunk of each block.

The indicator strings 412, 414 can have the same predetermined pattern or different predetermined patterns. If the indicator strings 412, 414 have the same predetermined pattern, e.g., the memory cells in the indicator strings 412, 412 being in the same predetermined states, in one read operation, a read voltage can be applied to word lines $WL_0$, $WL_1$, ... $WL_n$ and voltage changes of corresponding bit lines connected to the indicator strings 412, 414 can be detected, respectively, to determine whether memory cells in the indicator strings 412, 414 suffer from read disturbance, respectively.

If the indicator strings 412, 414 have different predetermined patterns, e.g., the memory cells in the indicator strings 412, 414 are in different predetermined states, e.g., S1 ("01") and S2 ("00"), different read voltages may be applied in different read operations. For example, in a first read operation, a first read voltage, e.g., a voltage larger than the predetermined threshold voltages for S1 but smaller than the predetermined threshold voltages for S2, is applied to the word lines, and voltage changes of one or more corresponding bit lines coupled to the indicator string 412 are detected. The bit lines coupled to the indicator string 412 can be precharged. The bit lines coupled to the indicator string 414 can be set to a ground voltage. In a second read operation, a second read voltage, e.g., a voltage larger than the predetermined threshold voltages for S2 but smaller than the predetermined threshold voltages for S3, is applied to the word lines, and voltage changes of one or more corresponding bit lines coupled to the indicator string 414 are detected. The bit lines coupled to the indicator string 414 can be precharged. The bit lines coupled to the indicator string 412 can be set to a ground voltage.

After the read operation(s), whether the block is a high risk block can be determined based on the results of determining whether memory cells in the indicator strings 412, 414 suffer from read disturbance. In some cases, the block is determined to be a high risk block if all the indicator strings have read disturbance in their memory cells. In some cases, the block is determined to be a high risk block based on a statistical analysis, e.g., when a ratio of a number of the indicator strings suffering from read disturbance over the total number of indicator strings in the block is beyond a threshold.

In some implementations, the predetermined pattern of the indicator string 412 or 414 can be changed based on erase cycles or other methodology. For example, when the erase cycles increase, the predetermined states of the memory cells in the indicator string 412 or 414 can be changed from a lower-threshold-voltage state to a higher-threshold-voltage state, e.g., from S1 ("01") to S2 ("00").

Figure 5A:
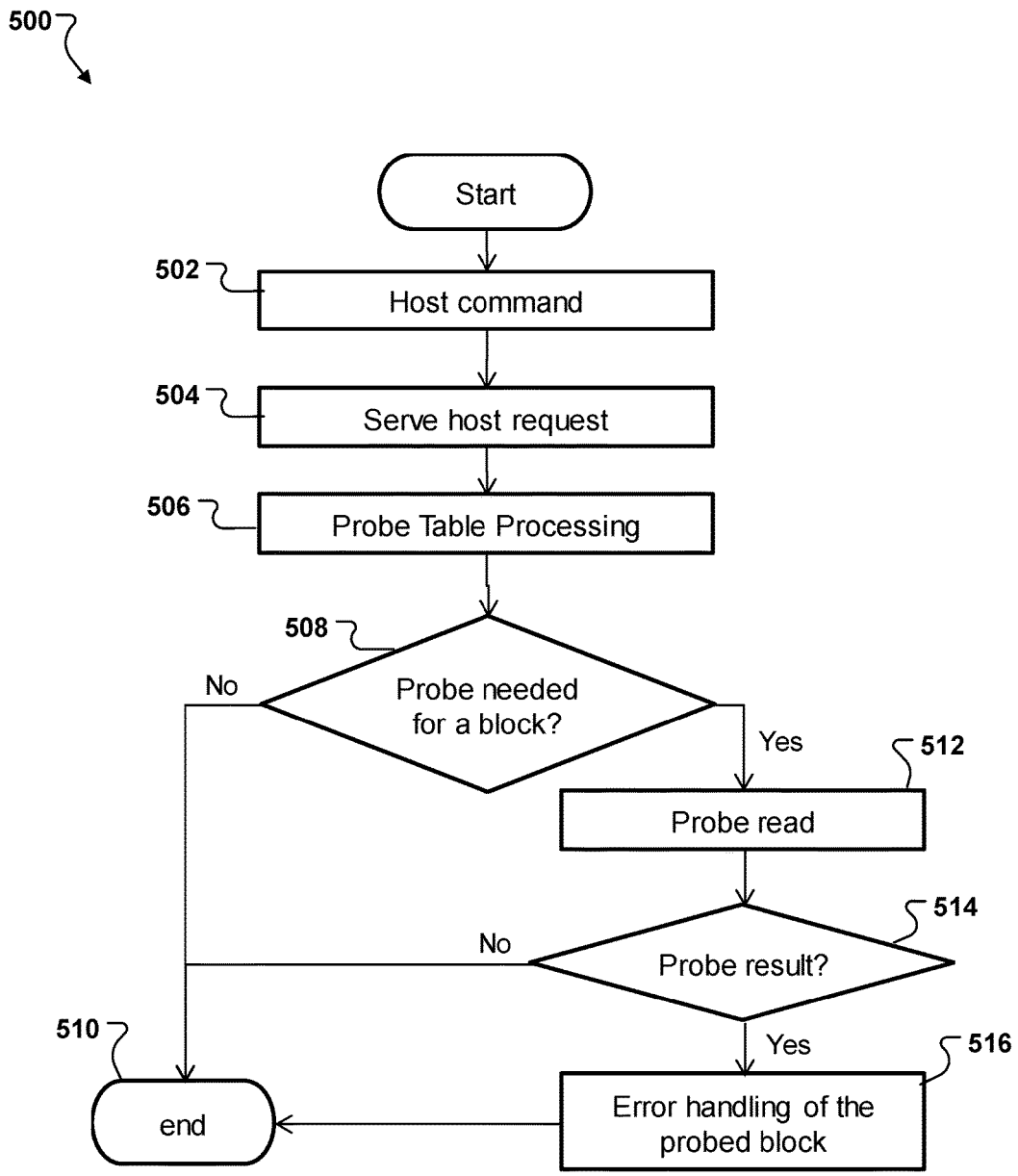
FIG. 5A illustrates an example of a process to probe a block for read disturbance, according to one or more implementations.

FIG. 5A illustrates an example of a process 500 to probe read disturbance in a block, according to one or more implementations. The process 500 can be performed by a memory controller, e.g., the device controller 112 of FIG. 1A, on a memory, e.g., the memory 116 of FIGS. 1A-1C. The memory includes a plurality of blocks.

The memory controller receives a host command (502), e.g., from a host device such as the host device 120 of FIG. 1A. The host command may include a host request for detecting data integrity, e.g., read disturbance of the memory.

The memory controller serves the host request (504), e.g., in response to receiving the host command. The memory controller probes the blocks by processing respective tables for the blocks (506) to determine whether an individual block is needed for probing (508). For example, the memory controller can maintain a table of each block and probe a block when a content of the respective table meets a certain condition. In some examples, each block may correspond to a read count table. When the block is read, the read count increases by a predetermined value, e.g., 1. If the read count of a block exceeds a predetermined threshold, in some cases, the controller can start to probe the block in response to the host command; in some cases, the controller can start the probing action automatically and without the host request. The probing of the block can be completed when the memory controller is serving the host request.

If the memory controller determines that there is no need for probing the block in step 508, the memory controller ends the probing (510). In some cases, the memory controller can continue to check another block by repeating steps 506 and 508.

Figure 5B:
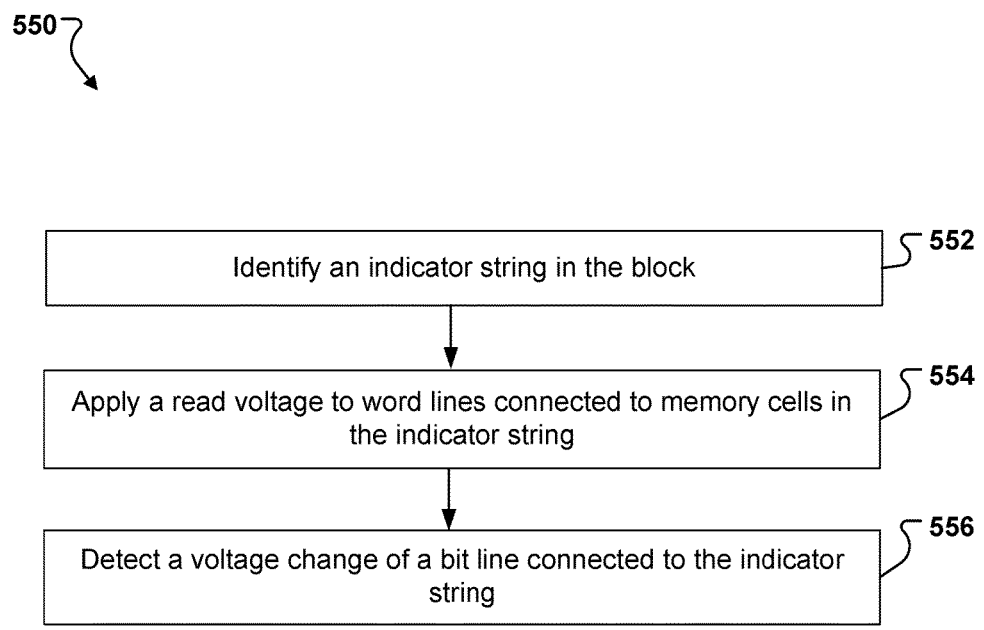
FIG. 5B illustrates an example of a process to detect read disturbance in a block, according to one or more implementations.

If the memory controller determines that the block needs to be probed, the memory controller performs the probe reading on the block (512). The probe reading can be similar to what is illustrated in FIGS. 2A-2B, FIGS. 3A-3B, or FIG. 4. Referring now to FIG. 5B, an example of a process 550 to detect read disturbance of a block is illustrated. The step 512 can be achieved by the process 550.

The memory controller identifies an indicator string in the block (552). As noted above, the indicator string can be predetermined (e.g., pre-programmed) in the block with other data strings. The indicator string can be the indicator string S100 of FIG. 2B, S300 of FIG. 3B, 412 or 414 of FIG. 4. The indicator string includes a plurality of memory cells coupled in series to a corresponding bit line. The plurality of memory cells is in a same predetermined state, e.g., S1 of FIG. 2A, and each of the memory cells has a threshold voltage in the predetermined state. In some cases, a string is selected from a plurality of strings in the block and programmed to be an indicator string for detecting read disturbance of the block.

The memory controller applies a read voltage to word lines connected to the memory cells in the indicator string (554). The read voltage can be larger than the threshold voltage. In some cases, as illustrated in FIGS. 2A-2B, the read voltage is applied to all the memory cells. In some cases, as illustrated in FIGS. 3A-3B, the read voltage is applied to a first part of the memory cells that is in the pre-programmed state and a second read voltage is applied to a second part of the memory cells that is un-programmed.

The memory controller detects a voltage change (or a change of a voltage) of the bit line connected to the indicator string (556). In some implementations, before the read voltage is applied, the memory controller applies a pre-charge voltage on the corresponding bit line coupled to the indicator string. The memory controller can wait a period of time to detect whether the voltage of the bit line changes.

Referring back to FIG. 5A, the memory controller analyzes the probe result (514). If the voltage of the bit line changes, it indicates that a path forms in the indicator string to discharge the electronic charges on the bit lines, and the memory cells are all turned on. Based on the probe result, the memory controller can determine that that there is no memory cell in the indicator string having a present threshold voltage larger than the read voltage and/or that no memory cell in the indicator string suffers from read disturbance. Accordingly, the process 500 proceeds to the end 510.

If the voltage of the bit line does not change, it indicates that the path does not form and at least one of the memory cells in the indicator string is turned off. Based on the probe result, the memory controller can determine that there is at least one memory cell having a present threshold voltage larger than the read voltage and/or that at least one memory cell in the indicator string suffers from read disturbance.

In response to determining that at least one memory cell in the indicator string suffers from the read disturbance, the memory controller can proceed to error handling of the probed block (516). For example, the memory controller can log the block to be a high-risk block. The memory controller can perform ECC correction on the block or erase the whole block.

FIGS. 6A to 9 show example implementations of detecting data retention of a memory system, e.g., the memory 116 of FIGS. 1A-1C, using a memory controller, e.g., the device controller 112 of FIG. 1A.

Figure 6A:
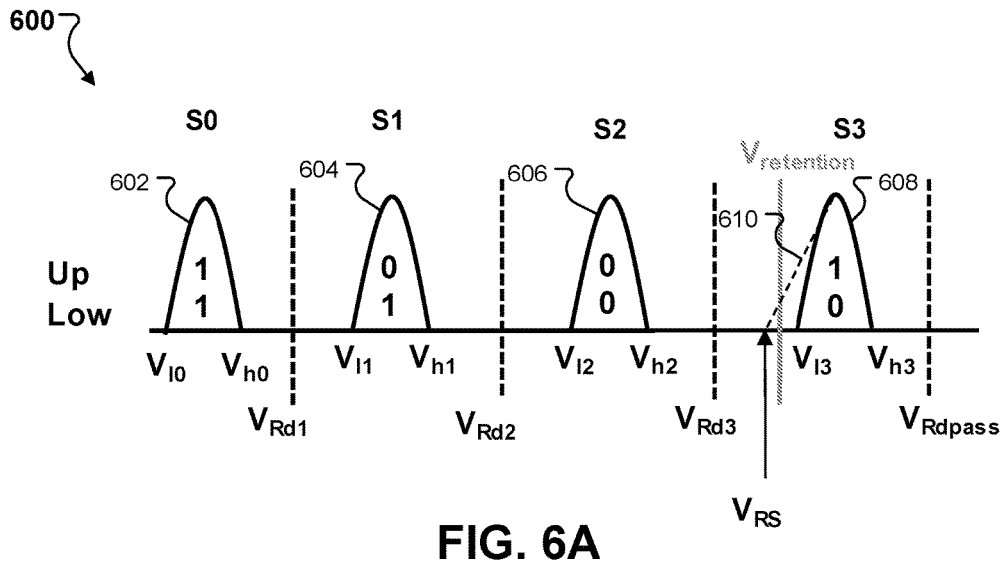
FIG. 6A illustrates an example of threshold voltage distributions and read voltages of memory cells for different states, according to one or more implementations.

Referring to FIG. 6A, an example 600 of threshold voltage distributions and read retention voltages of a memory cell, e.g., the memory cell 122 of FIG. 1C, for different states is illustrated. As discussed above in FIG. 2A, the memory cell can be an MLC capable of storing two-bit data. The memory cell can be programmed or erased to have any one of four states S0, S1, S2, and S3. In some examples, S0 is an erased state (1,1), and S1, S2, S3 are a plurality of programmed states P1 (0, 1), P2 (0, 0), and P3 (1, 0). Each state corresponds to a distribution of threshold voltages between a lower limit voltage and a higher limit voltage. For example, if the memory cell has a threshold voltage between Vl0 and Vh0, the memory cell is in the state S0; if the memory cell has a threshold voltage between Vl1 and Vh1, the memory cell is in the state S1; if the memory cell has a threshold voltage between Vl2 and Vh2, the memory cell is in the state S2; and if the memory cell has a threshold voltage between Vl3 and Vh3, the memory cell is in the state S3. Curves 602, 604, 606, 608 show distributions of the respective states S0, S1, S2, S3 of the memory cell, respectively.

During a read operation, a read voltage can be applied to a word line coupled to a gate of the memory cell to determine whether the selected memory cell is a turned-on or turned-off state. When a read voltage $V_{Rd1}$ that is larger than the threshold voltages of S0 but smaller than the threshold voltages of S1 is applied, the memory cell is turned on when it is in the state S0 and turned off when it is in the state S1, S2, or S3; when a read voltage $V_{Rd2}$ that is larger than the threshold voltages of S1 but smaller than the threshold voltages of S2 is applied, the memory cell is turned on when it is in the state S0 or S1 and turned off when it is in the state S2, or S3; when a read voltage $V_{Rd3}$ that is larger than the threshold voltages of S2 but smaller than the threshold voltages of S3 is applied, the memory cell is turned on if it is in the state S0, S1, or S2 and off when it is in the state S3. When the read voltage $V_{Rdpass}$ that is larger than all the threshold voltages of the states S0, S1, S2, S3 is applied, the memory cell is turned-on state whatever state the memory cell has.

When a program operation is performed on the memory cell, the memory cell traps charges. That is, the programmed memory cell stores charges. The longer time elapses or the read number of the memory cell increases after the memory cell is programmed, the more the memory cell deteriorates. When the memory cell deteriorates, the charges stored in the memory cell may flow out of the memory cell. When the stored charges flow out of the memory cell, the reliability of data cannot be guaranteed. For example, the distribution of the programmed state may be changed, that is, the threshold voltage for the programmed state may change accordingly. As exemplified in FIG. 6A, the distribution 608 of the programmed state S3 ("10") may be degraded and become to include a dotted curve 610, which has a new lower limit voltage $V_{RS}$ smaller than the lower limit voltage $V_{l3}$ for the programmed state S3. A difference between the new lower limit voltage $V_{RS}$ and the previous lower limit voltage $V_{l3}$ is a retention shift of the programmed state S3.

Due to the data retention, a read fail may occur. For example, as illustrated in FIG. 6A, when a retention read voltage $V_{retention}$ is applied, the memory cell being in the state S3 is a turned-off state if the memory cell does not suffer from data retention and the low limit voltage is $V_{l3}$; the memory cell is a turned-on state if the memory cell suffers from data retention and the low limit voltage changes from $V_{l3}$ to $V_{RS}$. Thus, by detecting whether the memory cell is on or off under a specific read condition, it can be determined whether or not the memory cell suffers from data retention. In some cases, memory cells being in states having higher threshold voltages, e.g., S2 and S3, are more susceptible to data retention.

Figure 6B:
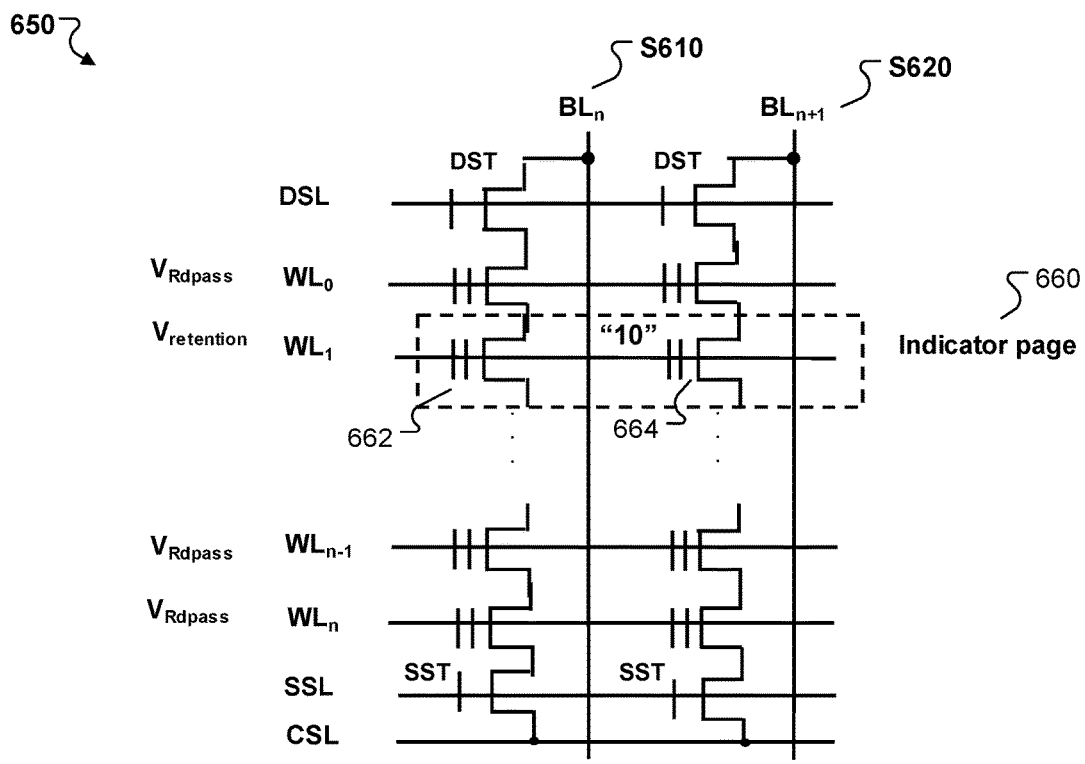
FIG. 6B shows an example circuit diagram illustrating a method of detecting data retention in a block of a NAND flash memory device, according to one or more implementations.

FIG. 6B shows an example circuit diagram 650 illustrating a method of detecting data retention in a block of a NAND flash memory device, according to one or more implementations. The block includes a plurality of pages, e.g., the page 130 of FIG. 1C, coupled to respective word lines $WL_0$, $WL_1$, $WL_{n-1}$, $WL_n$. One of the pages can be selected as an indicator page 660. The indicator page 660 includes a plurality of memory cells 662, 664 coupled in series to a respective word line $WL_1$. Each memory cell 662 or 664 in the indicator page 660 is also coupled in a respective string S610 or S620. The string S610 or S620 can be the string 120 of FIG. 1C, the string S100 or S200 of FIG. 2B, or the string S300 of FIG. 3B.

The indicator page 660 can be programmed to have a programmed pattern. In some implementations, the memory cells 662, 664 in the indicator page 660 are in a same programmed state, e.g., S3 (or "10"). In some implementations, the memory cells 662, 664 in the indicator page 660 are in different programmed states. For example, the memory cell 662 can be in a programmed state S2 (or "00"), and the memory cell 664 can be in a programmed state S3 (or "10"). In a particular example, the indicator page 660 includes a first number of memory cells being in the programmed state S3, a second number of memory cells being in the programmed state S2, a third number of memory cells being in the programmed state S1, and a fourth number of memory cells being in the erased state S0. The first number, the second number, the third number, and the further number can be 5:3:1:1. For illustration purposes only, in the following description, the memory cells in the indicator page 660 are in a programmed state S3 and each have a threshold voltage between the lower limit voltage $V_{l3}$ and the higher limit voltage $V_{h3}$.

During a read operation, a retention read voltage $V_{retention}$ is applied to the word line $WL_1$ coupled to the indicator page 660. As illustrated in FIG. 6A, the retention read voltage $V_{retention}$ is smaller than the predetermined threshold voltages for the state S3, e.g., smaller than the lower limit voltage $V_{l3}$. A pass voltage $V_{Rdpass}$ is applied to all the other word lines $WL_0$, $WL_{n-1}$, $W_n$. Accordingly, the memory cells coupled to the other word lines $WL_0$, $WL_{n-1}$, $W_n$ 252b receive the pass voltage $V_{Rdpass}$ at their gates and are turned on regardless of whatever state the memory cells may have.

If the memory cell 662 in the indicator page 660 has no data retention, the threshold voltage of the memory cell 662 is larger than the retention read voltage, the memory cell 662 is a turned-off state when the retention read voltage is applied. As discussed above in FIG. 2B, although all the other memory cells receiving the pass voltage are turned-on states, a path for transferring electric charges along the string S610 does not form, thus, no voltage change of the corresponding bit line $BL_n$ coupled to the string S610 is detected.

If the memory cell 662 in the indicator page 660 has data retention but the present threshold voltage of the memory cell 662 is larger than the retention read voltage, the memory cell 662 is also a turned-off state when the retention read voltage is applied. As noted above, the path for transferring electric charges along the string S610 does not form, and thus, no voltage change of the corresponding bit line $BL_n$ coupled to the string S610 is detected.

If the memory cell 662 in the indicator page 660 has data retention and the present threshold voltage of the memory cell 662 is smaller than the retention read voltage, e.g., as illustrated in FIG. 6A, $V_{RS}<V_{retention}$, the memory cell 662 is a turned-on state when the retention read voltage is applied. As discussed above in FIG. 2B, all the other memory cells receiving the pass voltage are turned-on states, thus a path for transferring electric charges along the string S610 can form, and accordingly a voltage change of the corresponding bit line $BL_n$ coupled to the string S610 can be detected.

Thus, by applying a retention read voltage on the memory cell 662 in the indicator page 660 and detecting a voltage change of the corresponding bit line $BL_n$ coupled to the string S610 that includes the memory cell 662, the memory controller can determine whether the memory cell 662 is a turned-on or turned off state and whether the retention read voltage $V_{retention}$ is larger or smaller than the present threshold voltage $V_{RS}$.

In some cases, in response to determining that there is no voltage change for the corresponding bit line $BL_n$, the memory controller can increase the retention read voltage $V_{retention}$ to perform a next read operation until a voltage change is detected on the bit line $BL_n$ when the retention read voltage $V_{retention}$ reaches the present threshold voltage $V_{RS}$. In some cases, in response to determining that there is a voltage change for the corresponding bit line $BL_n$, the memory controller can decrease the retention read voltage $V_{retention}$ to perform a next read operation until a voltage change is detected on the bit line $BL_n$ when the retention read voltage $V_{retention}$ reaches the present threshold voltage $V_{RS}$.

When the retention read voltage $V_{retention}$ reaches the present threshold voltage $V_{RS}$, the retention shift of the memory cell 662 can be determined to be a difference between the retention read voltage $V_{retention}$ and the lower limit voltage $V_{l3}$.

In some implementations, the indicator page 660 includes a single page. In some implementations, the indicator page 660 includes two or more single pages. Each page can have a predetermined pattern. The two or more single pages can include memory cells with different programmed states. In one read operation, two or more retention read voltages can be applied to respective memory cells in the two or more single pages. The memory controller can determine whether the indicator page passes or fails based on a result of the read operation.

Similarly, by applying a retention read voltage on the memory cell 664 in the indicator page 660 and detecting a voltage change of the corresponding bit line $BL_{n+1}$ coupled to the string S620 that includes the memory cell 664, the memory controller can determine whether the memory cell 664 is a turned-on or turned off state and whether the retention read voltage $V_{retention}$ is larger or smaller than the present threshold voltage $V_{RS}$. The memory controller can also determine the retention shift of the memory cell 664.

In some implementations, a predetermined retention read voltage is applied to the word line $WL_1$ coupled to the memory cells in the indicator page 660. The predetermined retention read voltage can be smaller than the threshold voltage of the memory cells in the state. By detecting a voltage change of corresponding bit lines $BL_n$, $BL_{n+1}$ coupled to the strings S610, S620 including the respective memory cells 662, 664 of the indicator page 660, the memory controller can determine whether the respective memory cells 662, 664 are turned on or turned off. If a memory cell is turned on, the memory controller can determine that the memory cell fails or suffers from a certain degree of data retention. If the memory cell is turn off, the memory controller can determine that the memory cell passes or does not fail, does not suffer from data retention, or at least does not suffer from the certain degree of data retention. Thus, the memory controller can determine the number of failed memory cells in the indicator page 660.

In some implementations, based on the determined retention shifts and/or the number of failed memory cells in the indicator page 660, the memory controller can determine whether the indicator page 660 fails, e.g., by comparing the determined retention shifts to a predetermined retention shift threshold and/or comparing the number of failed memory cells to a predetermined threshold number.

Figure 8A:
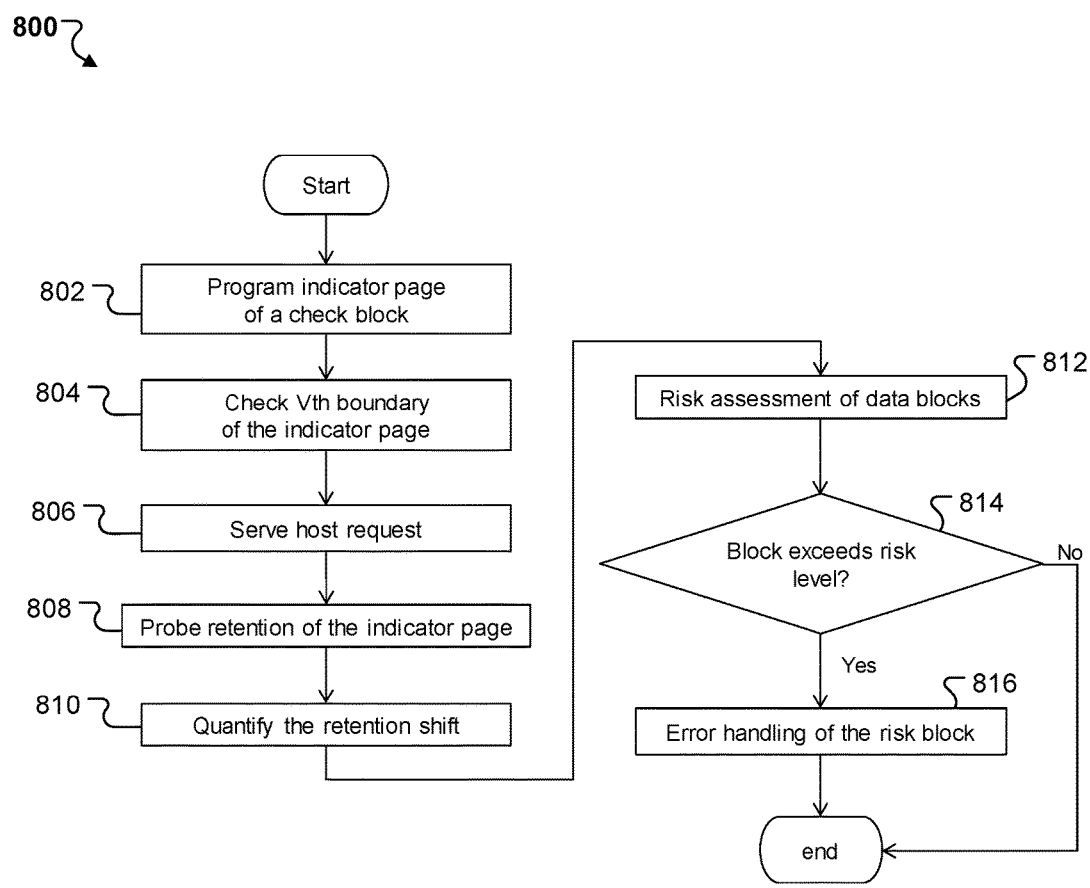
FIG. 8A illustrates an example of a process to detect data retention of a memory system including multiple blocks, according to one or more implementations.
Figure 9:
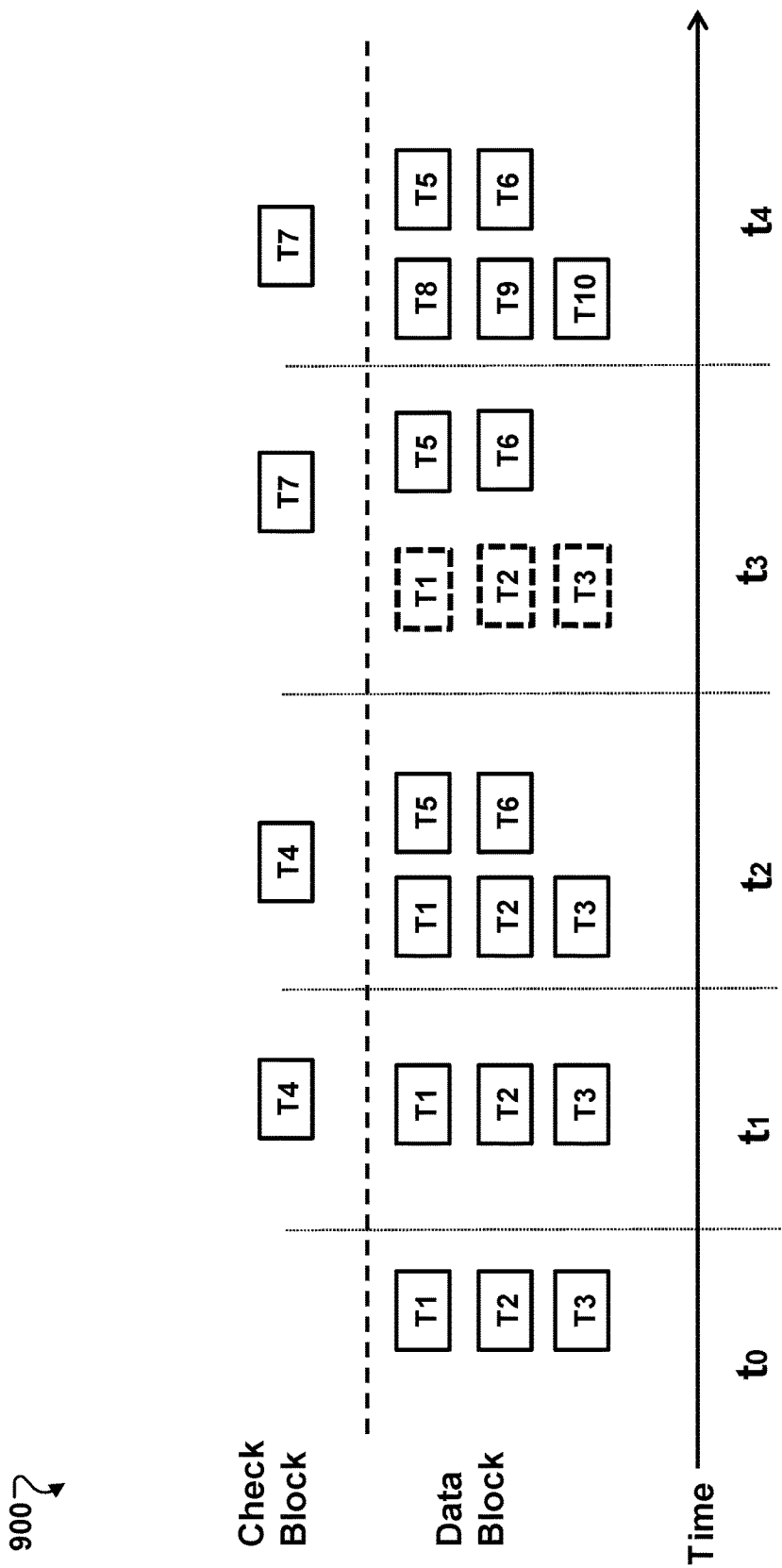
FIG. 9 shows an example of data retention detection in a memory system including multiple blocks, according to one or more implementations.

In some implementations, as discussed with further details in FIGS. 8A, 8B and 9, the memory controller can evaluate other data blocks using the determined retention shifts and/or the number of failed memory cells in the indicator page 660 to determine whether a data block exceeds a risk level. If the data block exceeds a risk level, the memory controller can perform error handling of the data block, e.g., similar to step 516 of FIG. 5A.

Figure 7A:
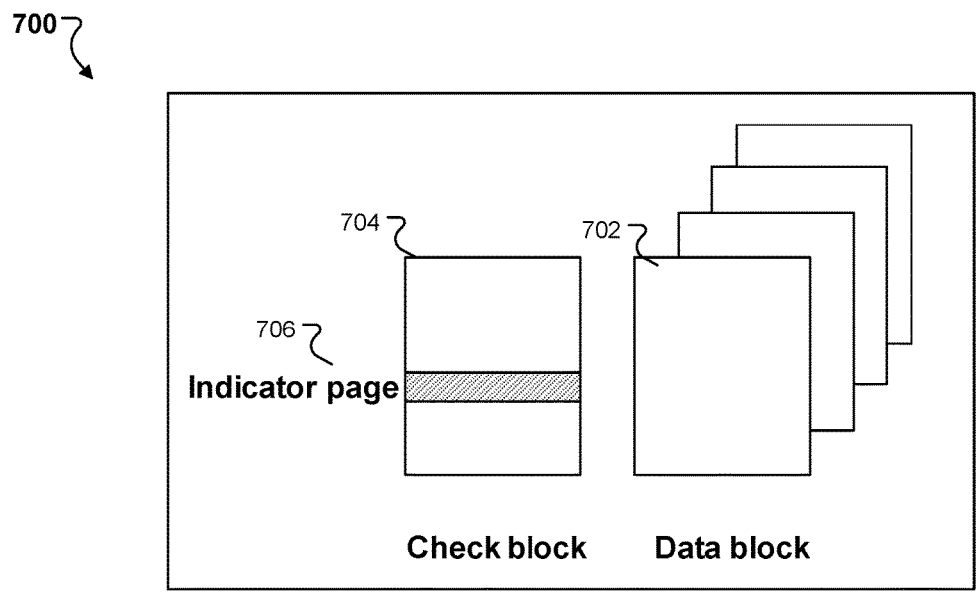
FIG. 7A illustrates an example memory system for detection of data retention, according to one or more implementations.

FIG. 7A illustrates an example memory 700 for detection of data retention, according to one or more implementations. The memory 700 can be the memory 116 of FIGS. 1A-1B. The memory 700 includes a plurality of blocks, e.g., the block 118 of FIGS. 1B-1C. In some implementations, a block, e.g., a blank block without programmed memory cells, is selected as a check block 704. The check block 704 is configured to provide one or more indicator pages 706 for data retention detection of other data blocks 702 in the same memory 700, as discussed in further details in FIGS. 8A, 8B, and 9.

Figure 7B:
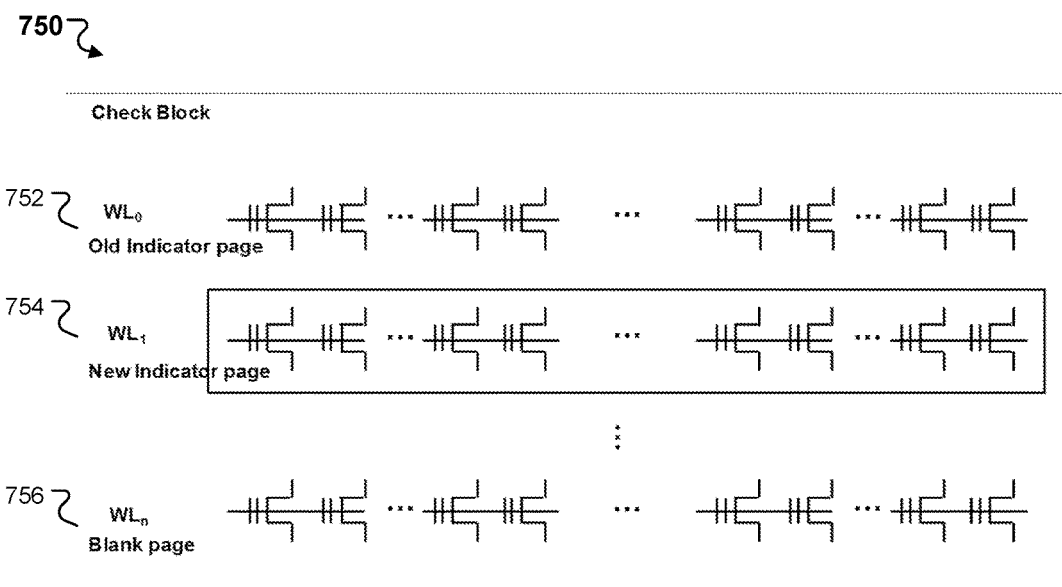
FIG. 7B illustrates an example check block for detection of data retention, according to one or more implementations.

FIG. 7B illustrates an example check block 750 for detection of data retention, according to one or more implementations. The check block 750 can be the check block 704 of FIG. 7A. The check block 750 includes a plurality of indicator pages 752, 754, 756 coupled to respective word lines $WL_0$, $WL_1$, $WL_n$. The indicator pages can be the indicator page 660 of FIG. 6B. The memory controller can select, e.g., in order, an indicator page in the check block 750 as a current or new indicator page. For example, if an indicator page 752 fails during a check (or a data retention detection) by the memory controller, as discussed in FIG. 6B, the memory controller can log the indicator page 752 to be an old indicator page. The memory controller can choose a new indicator page 754. In some cases, the new indicator page 754 has a predetermined pattern. In some cases, a blank page like the blank page 756 without programmed memory cells is chosen, and the memory controller can program the blank page with a pattern to be the new indicator page 754.

The memory controller can continue choosing a next indicator page in the check block 750 for data retention detection when a previous indicator page fails in a check. When the last page in the check block 750 is used, the memory controller can choose a new block from an unused block region in the memory 700 and use the new block as a check block. The memory controller can make the check block similar to other data blocks, so that the memory controller can determine a performance of the other data blocks based on a detection of the performance of the check block.

In some implementations, in a first check operation, the memory controller chooses a block as a check block and program one page in the check block with a predetermined pattern as an indicator page. In a second check operation, the memory controller can choose another page in the check block as a new indicator page, or choose another block as a new check block and program on of the pages in the new check block as the new indicator page.

FIG. 8A illustrates an example of a process 800 to detect data retention of a memory including multiple blocks, according to one or more implementations. The process 800 can be performed by a memory controller, e.g., the device controller 112 of FIG. 1A, on the memory, e.g., the memory 116 of FIGS. 1A-1C. The memory includes a plurality of blocks.

The memory controller programs an indicator page of a check block in the memory (802). As noted above, the check block can be a dedicated block in the plurality of blocks and configured to be for data retention detection to evaluate risk level of other data blocks in the memory. The check block can be the check block 706 of FIG. 7A or 750 of FIG. 7B. The indicator page can be programmed with a predetermined pattern. For example, memory cells in the indicator page can be programmed to be in at least one memory state and each of the memory cells has a threshold voltage corresponding to the memory state.

The memory controller checks a threshold voltage boundary of the indicator page (804). For example, for the memory state S3 ("10") as illustrated in FIG. 6A, the threshold voltage of a memory cell in the state S3 is within a range between a lower limit voltage $V_{l3}$ and a higher limit voltage $V_{h3}$. The memory controller can check what is the present lower limit voltage for the programmed memory cells in the indicator page. In some examples, as discussed above, the memory controller can apply a read voltage to a word line coupled to the indicator page and a pass voltage on all other word lines and detect a voltage change of a respective bit line coupled to a memory cell in the indicator page. The memory controller can start to use the predetermined lower limit voltage $V_{l3}$ as the read voltage and then increase or decrease the read voltage until it reaches the present lower limit voltage, which can be considered as the threshold voltage boundary of the indicator page.

The memory controller serves a host request (806). The memory controller may receive a host command from a host device, e.g., the host device 120 of FIG. 1A. The host command can include the host request for detecting data retention of the memory. In response to serving the host request, the memory controller starts to probe or detect retention of the indicator page (808).

In some implementations, the memory controller first receives the host command from the host device (step 806), then chooses a page from a block as an indicator page and then perform steps 802 and 804. After performing the step 804, the memory controller continues to perform step 808. In some implementations, the memory controller starts to probe or detect retention of the indicator page automatically or as a background operation.

The memory controller quantifies the retention shift of the memory cells in the indicator page (810). As discussed above in FIG. 6B, the memory controller can apply a retention read voltage to a word line coupled to the memory cells in the indicator page and a pass voltage to other word lines and detect a voltage change of a respective bit line coupled to each of the memory cells in the indicator page. Based on the detection of the voltage change of the respective bit line, the memory controller can determine whether the memory cell is a turned-on or turned off state and whether the retention read voltage is larger or smaller than a present threshold voltage. The memory controller can then increase or decrease the retention read voltage to perform a next read operation until the retention read voltage reaches the present threshold voltage. Then the memory controller can determine the retention shift of the memory cell, that is, a difference between the retention read voltage (identical to the present threshold voltage) and the threshold voltage boundary checked or determined in step 804. If the memory cells in the indicator page have the same predetermined state, the memory cells may have the same retention shift, which can be also considered to be the retention shift of the indicator page.

The memory controller performs risk assessment of one or more other data blocks in the memory (812). For example, the memory controller can use the determined retention shift of the indicator page and one or more corresponding parameters of the one or more other data blocks. The memory controller can have tables of information for the blocks in the memory.

FIG. 8B illustrates example tables of information of blocks, according to one or more implementations. Example Table A includes time stamp information of data blocks, e.g., when the data blocks are programmed or elapsing time from the first programmed time. Example Table B includes P/E (programmed/erased) cycle information of data blocks, e.g., how many times the data blocks have been programmed/erased. Example Table C includes relations of data retention versus P/E cycles. Normally, the larger the P/E cycles a data block has, the larger the data retention of the data block has. The memory controller can use information in one or more of the tables.

Referring back to FIG. 8A, the memory controller can determine whether a block exceeds a risk level (814) by a result of the risk assessment of the block. For example, if the indicator page has a retention shift exceeding a predetermined retention shift threshold corresponding to a risk level, the memory controller determines that the indicator page fails or the indicator page exceeds the risk level. Then, if a block has a longer elapsing time (and/or more P/E cycles) than the indicator page, the memory controller determines that the block exceeds the risk level. If the memory controller determines that the block exceeds the risk level, the memory controller performs error handling of the risk block (816). For example, the memory controller can erase the whole block or log the block as high risk.

If the indicator page has a retention shift lower than the predetermined retention shift, the memory controller determines that the indicator page does not fail or the indicator page does not exceed the risk level. Then if the block has a shorter elapsing time (and/or less P/E cycles) than the indicator page, the memory controller determines that the block does not exceed the risk level. If the memory controller determines that the block does not exceed the risk level, the process 800 ends. The memory controller can continue to evaluate a next data block in the memory by repeating steps 812 and 814.

In some implementations, as discussed above, the memory controller can also apply a predetermined retention read voltage to the indicator page to determine how many memory cells in the indicator page fail. Based on the failed memory cells in the indicator page and ECC data of a data block, the memory controller can determine whether the data block exceeds a risk level. For example, if the data block has a shorter elapsing time (and/or less P/E cycles) than the indicator page and the ECC data can correct failed bits in the indicator page, the memory controller can determine that the data block does not exceed a risk level. If the data block has a longer elapsing time (and/or more P/E cycles) than the indicator page and the ECC data cannot correct failed bits in the indicator page, the memory controller can determine that the data block exceeds a risk level.

FIG. 9 illustrates an example 900 of data retention detection in a memory, according to one or more implementations. The example 900 can be performed by a memory controller, e.g., the device controller 112 of FIG. 1A, on the memory, e.g., the memory 116 of FIGS. 1A-1C. The memory includes a plurality of blocks Tx, where x corresponds to an elapsing time of a block. The smaller the x value is, the longer elapsing time the block has and the more serious retention the block may have. The blocks can have the same P/E cycle.

At time t0, the memory has three data blocks labelled as T1, T2, T3. At time t1, the memory controller selects a check block T4. The check block T4 can be the check block 704 of FIG. 7A or 750 of FIG. 7B.

The memory controller can perform a check operation on the check block T4. For example, the memory controller can perform a check operation on an indicator page in the check block T4. As discussed above, the memory controller can apply one or more retention read voltages to a word line coupled to the indicator page and then determine a retention shift of memory cells in the indicator page or a number of failed memory cells in the indicator page. The memory controller can determine that the indicator page (thus the check block) passes the check if the determined retention shift is smaller than a predetermined retention shift threshold and/or the number of failed memory cells is smaller than a predetermined threshold value. The memory controller can determine that the indicator page (thus the check block T4) fails the check if the determined retention shift is larger than the predetermined retention shift threshold and/or the number of failed memory cells is larger than the predetermined threshold value.

At time t2, the memory controller performs a check operation on the check block T4 and determines that the check block T4 passes. Thus, the memory controller can further determine that the older data blocks T1, T2, T3 and two newer data blocks T5 and T6 are safe or low-risk blocks.

At time t3, the memory controller performs another check operation on the check block T4 and determines that the check block T4 fails. Since the older data blocks T1, T2, T3 have longer elapsing time than the check block T4, the memory controller marks the older data block T1, T2, T3 to be high-risk blocks. Since the data blocks T5 and T6 have shorter elapsing time than the check block T4, the memory controller can consider that the data blocks T5 and T6 are safe or low-risk blocks. Meanwhile, as the check block T4 fails, the memory controller can choose a new check block T7.

At time t4, the memory controller performs error handling on the high-risk blocks, e.g., the older data blocks T1, T2, T3. The memory controller can refresh the high-risk blocks T1, T2, T3 to new data blocks T8, T9, T10.

In some implementations, as discussed above in FIGS. 2A to 5B, a memory controller can detect read disturbance of a block in a memory, e.g., NAND flash memory, by performing a read operation on an indicator string in the block. In some implementations, as discussed above in FIGS. 6A to 9, a memory controller can detect data retention of an indicator page in a block in a memory and evaluate other data blocks based on the detected data retention.

In some implementations, a memory controller can perform both read disturbance detection and data retention detection for a memory. The memory controller can determine whether a block passes or fails based on results of the read disturbance detection and the data retention detection on the block. In some examples, the memory controller can first detect data retention of a block in the memory and then detect read disturbance of the block if the data retention of the block is smaller than a predetermined retention shift threshold. In some examples, the memory controller can first detect read disturbance of a block and then detect data retention of the block if the block passes the read disturbance detection. In some examples, the memory controller performs a read disturbance detection and a data retention detection on a block, separately, and then determines whether the block is a high-risk block based on the results of the read disturbance detection and the data retention detection.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory system for detection of read disturbance, comprising:
    a memory comprising multiple blocks each having a plurality of strings; and
    a memory controller configured to detect read disturbance of the memory by
        applying a read voltage to a plurality of memory cells of an indicator string in a particular block in the memory, the plurality of memory cells being coupled in series to a corresponding bit line, the memory cells being in a predetermined state and having a threshold voltage corresponding to the predetermined state, the read voltage being larger than the corresponding threshold voltages of the memory cells; and
        detecting a voltage change of the corresponding bit line to determine whether at least one memory cell in the indicator string suffers from read disturbance.

2. The memory system of claim 1, wherein the memory controller is configured to, if the voltage change of the corresponding bit line is detected, determine at least one of:
    a) no memory cell in the indicator string having a present threshold voltage larger than the read voltage, or
    b) no memory cell in the indicator string suffering from read disturbance.

3. The memory system of claim 1, wherein the memory controller is configured to, if the voltage change of the corresponding bit line is not detected, determine at least one of:
    a) at least one memory cell in the indicator string having a present threshold voltage larger than the read voltage, or b) at least one memory cell in the indicator string suffering from read disturbance.

4. The memory system of claim 3, wherein the memory controller is configured to:
in response to determining that at least one memory cell in the indicator string suffers from read disturbance, log the particular block as a high risk block.

5. The memory system of claim 1, wherein the memory controller is configured to:
apply a second read voltage to a second plurality of memory cells of a second indicator string in the particular block, the second plurality of memory cells being coupled in series to a second corresponding bit line, the second plurality of memory cells being in a second predetermined state and having a second threshold voltage corresponding to the second predetermined state, the second read voltage being larger than the corresponding second threshold voltages of the second plurality of memory cells;
detect a voltage change of the second corresponding bit line to determine whether at least one memory cell in the second indicator string suffers from read disturbance; and
determine whether the particular block is a high risk block based on a first result of determining whether at least one memory cell in the indicator string suffers from read disturbance and a second result of determining whether at least one memory cell in the second indicator string suffers from read disturbance.

6. The memory system of claim 5, wherein the indicator string and the second indicator string are arranged adjacent to respective data strings for storing data in the particular block.

7. The memory system of claim 1, wherein the memory controller is configured to:
identify a portion of the particular block including memory cells in a second state, the second state being different from the predetermined state, the memory cells in the second state having a second threshold voltage smaller than the threshold voltages of the memory cells in the predetermined state; and
apply a second read voltage to one or more memory cells in the indicator string that is in the portion of the particular block and has the second state, the second read voltage being smaller than the read voltage.

8. The memory system of claim 1, wherein the memory cells are capable to be programmed into a first state to have a first corresponding threshold voltage and a second state to have a second corresponding threshold voltage larger than the first corresponding threshold voltage, and
wherein the predetermined state is the first state, and the read voltage is between the first corresponding threshold voltage and the second corresponding threshold voltage.

9. A memory system for detection of data retention, comprising:
a memory comprising multiple blocks each including a plurality of pages; and
a memory controller configured to detect data retention of the memory by
selecting a page in a block of the memory as an indicator page, the page including a plurality of memory cells coupled in series to a corresponding word line;
programming the indicator page with a predetermined pattern in which the memory cells in the indicator page are in at least one programmed state, the memory cells having a threshold voltage corresponding to the programmed state;
performing a read operation on the indicator page by applying at least one retention read voltage to the corresponding word line of the indicator page and a pass voltage to word lines coupled to the other pages in the block, the retention read voltage being smaller than the threshold voltage; and
determining a retention state of one or more other blocks in the memory based on a result of the performed read operation on the indicator page in the block.

10. The memory system of claim 9, wherein the memory controller is configured to determine a retention shift of the memory cells in the indicator page based on a result of the performed read operation on the indicator page.

11. The memory system of claim 10, wherein the memory cells in the indicator page are coupled within respective strings connected to respective bit lines,
wherein the memory controller is configured to:
after performing the read operation on the indicator page, detect voltage changes of the respective bit lines;
in response to determining that the voltage changes for the respective bit lines are not detected, increase the retention read voltage to perform a next read operation until the voltage changes are detected on the respective bit lines when the retention read voltage reaches a present threshold voltage; and
in response to determining that the voltage changes for the respective bit lines are detected, decrease the retention read voltage to perform a next read operation until the voltage changes for the respective bit lines are not detected when the retention read voltage reaches the present threshold voltage, the present threshold voltage being smaller than the threshold voltage,
wherein the retention shift of the memory cells is determined to be a difference between the threshold voltage and the present threshold voltage.

12. The memory system of claim 10, wherein determining a risk retention state of one or more other blocks comprises:
determining the retention state of the one more other blocks based on the determined retention shift and one or more corresponding parameters of the one or more other blocks, the parameters including at least one of time stamp information, P/E cycle information, retention shift information, or a relation between retention shifts and P/E cycles.

13. The memory system of claim 10, wherein the memory controller is configured to:
determine that the indicator page fails if the determined retention shift of the memory cells is no smaller than a predetermined retention shift threshold; and
determine that the indicator page passes if the determined retention shift of the memory cells is smaller than the predetermined retention shift threshold.

14. The memory system of claim 13, wherein the memory controller is configured to:
in response to determining that the indicator page fails, program a blank page in the block with a new predetermined pattern as a new indicator page.

15. The memory system of claim 9, wherein the memory controller is configured to determine a number of failed memory cells based on a result of the performed read operation on the indicator page, the failed memory cells having a present threshold voltage smaller than the retention read voltage, and wherein determining a retention state of one or more other blocks comprises determining the retention state of the one more other blocks based on the determined number of failed memory cells and one or more corresponding error-correcting code (ECC) bit numbers of the one or more other blocks.

16. The memory system of claim 9, wherein the memory cells in the memory are capable to be programmed into a first state to have a first corresponding threshold voltage and into a second state to have a second corresponding threshold voltage larger than the first corresponding threshold voltage, and wherein the programmed state is the second state, the retention read voltage is between the first corresponding threshold voltage and the second corresponding threshold voltage, and the pass voltage is larger than the second corresponding threshold voltage.

17. The memory system of claim 16, wherein the predetermined pattern of the indicator page comprises a first plurality of memory cells being in the first state and a second plurality of memory cells being in the second state, and wherein performing the read operation on the indicator page comprises:

performing a first read operation on the first plurality of memory cells by applying a first retention read voltage to the corresponding word line of the indicator page, the first retention read voltage being smaller than the first corresponding threshold voltage; and performing a second read operation on the second plurality of memory cells by applying a second retention read voltage to the corresponding word line of the indicator page, the second retention read voltage being smaller than the second corresponding threshold voltage.

18. The memory system of claim 9, wherein the memory controller is configured to:

receive a request from an external device to detect data retention of the memory; and perform the read operation on the indicator page in the block in response to the request.

19. A memory system for detection of data integrity, comprising:

a memory comprising multiple blocks, each block having memory cells that are coupled in series to column bit lines to form strings and to row word lines to form pages; and a memory controller configured to detect data integrity of the memory by performing at least one of:

first operations for detecting read disturbance of the memory, or second operations for detecting data retention of the memory, wherein the first operations comprise:

applying a read voltage to a plurality of memory cells of an indicator string in a particular block in the memory, the plurality of memory cells being coupled in series to a corresponding bit line, the plurality of memory cells being in a predetermined state and having a threshold voltage corresponding to the predetermined state, the read voltage being larger than the threshold voltages of the plurality of memory cells; and detecting a voltage change of the corresponding bit line to determine whether read disturbance occurs in the indicator string, and wherein the second operations comprise:

selecting a page in a block of the memory as an indicator page, the page including a plurality of memory cells coupled in series to a corresponding word line;

programming the indicator page with a predetermined pattern in which the memory cells in the indicator page are in at least one programmed state, the memory cells having a threshold voltage corresponding to the programmed state;

performing a read operation on the indicator page by applying at least one retention read voltage to the corresponding word line of the indicator page and a pass voltage to word lines coupled to the other pages in the block, the retention read voltage being smaller than the threshold voltages of the memory cells in the programmed state; and determining a retention state of one or more other blocks in the memory based on a result of the performed read operation on the indicator page in the block.

20. The memory system of claim 19, wherein the one or more other blocks includes the particular block, and wherein the memory controller is configured to determine whether the particular block is a high risk block based on a first result of determining whether the read disturbance occurs in the indicator string of the particular block and a second result of determining the retention state of the particular block based on the result of the performed read operation on the indicator page.

* * * * *

UNITED STATES PATENT AND TRADEMARK OFFICE
CERTIFICATE OF CORRECTION

PATENT NO. : 9,984,759 B1  
APPLICATION NO. : 15/471262  
DATED : May 29, 2018  
INVENTOR(S) : Yuchih Yeh et al.

Page 1 of 1

It is certified that error appears in the above-identified patent and that said Letters Patent is hereby corrected as shown below:

On the Title Page

Column 1 (Notice), Line 3, after "0 days." delete "days.".

In the Claims

Column 24, Line 44, Claim 12, after "a" delete "risk".

Signed and Sealed this  
Sixth Day of November, 2018

Andrei Iancu  
*Director of the United States Patent and Trademark Office*